(12) United States Patent
Hamelin

(10) Patent No.: US 11,139,839 B1
(45) Date of Patent: Oct. 5, 2021

(54) POLAR CODE DECODER AND A METHOD FOR POLAR CODE DECODING

(71) Applicant: HUAWEI TECHNOLOGIES CO., LTD., Guangdong (CN)

(72) Inventor: Louis-Philippe Hamelin, Montreal (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/922,231

(22) Filed: Jul. 7, 2020

(51) Int. Cl.
  *H03M 13/45* (2006.01)
  *H03M 13/13* (2006.01)

(52) U.S. Cl.
  CPC ........... *H03M 13/45* (2013.01); *H03M 13/13* (2013.01)

(58) Field of Classification Search
  CPC .............................. H03M 13/45; H03M 13/13
  See application file for complete search history.

(56) References Cited

U.S. PATENT DOCUMENTS

| | | | | |
|---|---|---|---|---|
| 2007/0110108 A1* | 5/2007 | Kang | ................... | H04L 1/0059 370/515 |
| 2012/0266042 A1* | 10/2012 | Shen | ................. | H03M 13/6362 714/755 |
| 2013/0132806 A1* | 5/2013 | Vummintala | ..... | H03M 13/2975 714/800 |
| 2018/0198560 A1* | 7/2018 | Jiang | ...................... | H03M 13/29 |
| 2018/0206244 A1* | 7/2018 | Yang | ...................... | H04L 1/0045 |
| 2018/0331802 A1* | 11/2018 | Bhattad | ............. | H04W 36/0072 |
| 2019/0020448 A1* | 1/2019 | Wilson | .................... | H04L 5/005 |

OTHER PUBLICATIONS

Giard et al., "Multi-Mode Unrolled Architectures for Polar Decoders", IEEE Transactions on Circuits and Systems I: Regular Papers, 2016, vol. 63, Issue: 9, pp. 1443-1453.

* cited by examiner

*Primary Examiner* — Thien Nguyen
(74) *Attorney, Agent, or Firm* — BCF LLP

(57) ABSTRACT

The disclosed structures and methods are directed to polar code decoders and methods for polar code decoding. A polar code decoder comprises an input logarithmic likelihood ratio (LLR) distributor, a master polar decoder module (PDM), at least one slave PDM, an intermediate LLR result combiner, and a decoded bit aggregator configured to generate a decoded codeword bit sequence. For each codeword node, each PDM partially decodes one or more sets of LLR subsets, which are sent to the intermediate LLR result combiner to generate an intermediate LLR result sequence. A first node decoding pipeline of the master PDM is configured to decode an intermediate LLR result sequence to generate at least one decoded node bit sequence. A polar code decoder with slave PDMs each having a second node decoding pipeline is also disclosed. A method for polar code decoding is also disclosed.

20 Claims, 20 Drawing Sheets

←──────Column #0 - #127──────→

PDM #0 Sub-Unit #0 Input Storage

| 0-3 | 128-131 | 256-259 | ... | 3712-3715 | 3840-3843 | 3968-3971 |
|---|---|---|---|---|---|---|
| 4096-4099 | 4224-4227 | 4352-4355 | ... | 7808-7811 | 7936-7939 | 8064-8067 |
| 8192-8195 | 8320-8323 | 8448-8451 | ... | 11904-11907 | 12032-12035 | 12160-12163 |
| 12288-12991 | 12416-12419 | 12544-12547 | ... | 16000-16003 | 16128-16131 | 16256-16259 |
| 16384-16387 | 16512-16515 | 16640-16643 | ... | 20096-20099 | 20224-20227 | 20352-20355 |
| 20480-20483 | 20608-20611 | 20736-20739 | ... | 24192-24195 | 24320-24323 | 24448-24451 |
| 24576-24579 | 24704-24707 | 24832-24835 | ... | 28288-28291 | 28416-28419 | 28544-28547 |
| 28672-28678 | 28800-28803 | 28928-28931 | ... | 32384-32387 | 32512-32515 | 32640-32643 |

PDM #0 Sub-Unit #1 Input Storage

| 32-35 | 160-163 | 288-291 | ... | 3744-3747 | 3872-3875 | 4000-4003 |
|---|---|---|---|---|---|---|
| ... | ... | ... | ... | ... | ... | ... |
| 28704-28707 | 28832-28835 | 28960-28963 | ... | 32416-32419 | 32544-32547 | 32672-32675 |

PDM #0 Sub-Unit #2 Input Storage

| 64-67 | 192-195 | 320-323 | ... | 3776-3779 | 3904-3907 | 4032-4035 |
|---|---|---|---|---|---|---|
| ... | ... | ... | ... | ... | ... | ... |
| 38736-38739 | 28864-28867 | 28992-28995 | ... | 32448-32451 | 32576-32579 | 32704-32707 |

PDM #0 Sub-Unit #3 Input Storage

| 96-99 | 224-227 | 352-355 | ... | 3808-3811 | 3936-3939 | 4064-4067 |
|---|---|---|---|---|---|---|
| ... | ... | ... | ... | ... | ... | ... |
| 28768-28771 | 28896-28899 | 29024-29027 | ... | 32480-32483 | 32608-32611 | 32736-32739 |

↕ Row #0 - #7

FIG. 4

| CYCLE | #0 | #1 | #2 | #3 |
|---|---|---|---|---|
| Channel LLRs | Sub-Unit #0 Input Storage 331a | Sub-Unit #1 Input Storage 332a | Sub-Unit #2 Input Storage 333a | Sub-Unit #3 Input Storage 334a |
| PDM 221, PE #0-3 | LLR1: 0-3<br>LLR2: 16384-16387 | LLR1: 32-35<br>LLR2: 16416-16419 | LLR1: 64-67<br>LLR2: 16448-16451 | LLR1: 96-99<br>LLR2: 16480-16483 |
| PDM 221, PE #4-7 | LLR1: 128-131<br>LLR2: 16512-16515 | LLR1: 160-163<br>LLR2: 16544-16547 | LLR1: 192-195<br>LLR2: 16576-16579 | LLR1: 224-227<br>LLR2: 16608-16611 |
| ... | ... | ... | ... | ... |
| PDM 221, PE #508-511 | LLR1: 16256-16259<br>LLR2: 32640-32643 | LLR1: 16288-16291<br>LLR2: 32672-32675 | LLR1: 16320-16323<br>LLR2: 32704-32707 | LLR1: 16352-16355<br>LLR2: 32736-32739 |

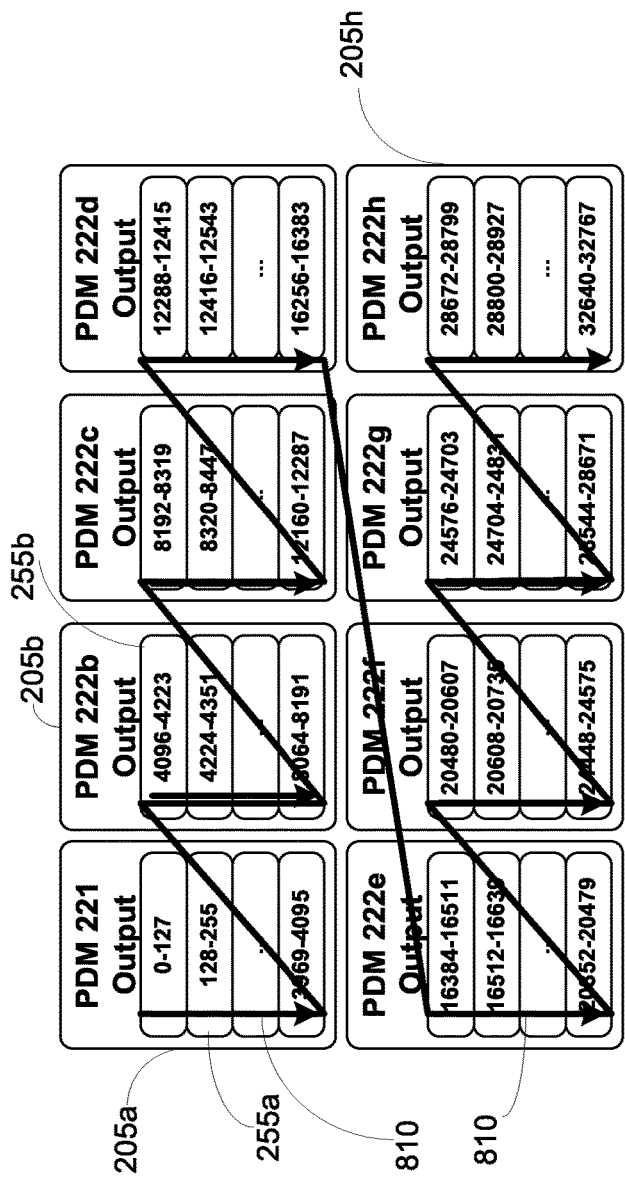

POLAR CODE DECODER AND A METHOD FOR POLAR CODE DECODING

FIELD OF THE INVENTION

The present invention generally relates to communication networks and, in particular, to polar code decoders and methods for polar code decoding.

BACKGROUND

Polar codes have been adopted by the 5G standard as channel coding for an enhanced mobile broadband (eMBB) control channel.

In order to encode information using polar codes, a polar encoder employs a conventional polar code construction procedure to generate a polar codeword that has a polar codeword length of N bits, where N is an integer. As many as K information bits are placed into the most reliable bit positions of the polar codeword and the remaining (N−K) bits of the polar codeword have zero value. The number of such zero-value bits, also referred to as "frozen" bits, is (N−K). A code rate R of such a polar codeword is defined as R=K/N. The positions of the frozen bits relative to the information bits within the polar codeword of N bits define a polar code construction method. These various characteristics of one polar codeword may be represented by a "codeword type", which is a characteristic of the polar codeword that depends on the polar codeword length, the number K of the information bits, and the polar code construction method.

After the polar codeword has been generated, the polar codeword is encoded using an N×N polar code matrix, where N is the number of bits of the polar codeword. An encoded polar codeword generated in such a manner is then transmitted through a communications network.

When the encoded polar codeword is received by a polar decoder, the polar decoder recovers the polar codeword by applying the N×N polar code matrix, equivalent to the matrix that was used by the polar encoder. The polar decoder also needs to have indications of the code rate R and the polar code construction method that was used to encode the polar codeword.

To use the polar code in modern communications networks, polar decoders need to rapidly decode the information and to be adaptable to various applications. The polar decoders also need to quickly adapt to different codeword types.

A long encoded polar codeword may comprise 1024 bits of data or more. Such a long encoded polar codeword may take a long time to decode using conventional techniques. For example, a known high-throughput technique, unrolled deeply-pipelined polar decoder (UDPPD), is not suitable for decoding codewords with polar codeword length of more than 2000 bits because of hardware complexity. UDPPD may process codewords of only a single codeword type and therefore is not flexible. UDPPD may not be suitable for use in communication systems because of its lack of flexibility. Although several UDPPDs could be combined into one device in order to support various codeword types, power consumption of complex hardware of such device may become an issue.

SUMMARY

An object of the present disclosure is to provide a polar code decoder and methods for polar code decoding that overcome the inconveniences of currently existing polar decoders. The object of the present disclosure includes providing the polar code decoder and the methods of decoding that may be adapted to various lengths of the codeword and to various applications requiring various throughput. In particular, codewords longer than 4096 bits may be decoded by the system described herein.

The polar code decoder as described herein may perform faster and consume less energy when compared to the currently existing polar decoders. Moreover, the polar code decoder and a method provided herein permit, while having the same or higher throughouput as the conventional techniques, decode codewords of various lengths with nodes of various types by adjusting to codewords of various lengths with nodes of various types. In other words, the polar code decoded provided herein may be flexible with regards to codewords of various lengths with nodes of various types. Moreover, the polar code decoder has less hardware units and elements compared to conventional polar code decoders.

In accordance with this objective, an aspect of the present disclosure provides a polar code decoder comprising: an input logarithmic likelihood ratio (LLR) distributor configured to receive a sequence of channel LLRs corresponding to at least one codeword node of an encoded codeword, and to generate sets of LLR subsets; a master polar decoder module (PDM) comprising a first node decoding pipeline, the master PDM configured to receive at least one first set of LLR subsets from the input LLR distributor, and, for each encoded codeword node: partially decode one of the at least one first set of LLR subsets to generate a first set of intermediate LLR results; and decode an intermediate LLR result sequence in the first node decoding pipeline to generate a decoded node bit sequence corresponding to the codeword node; at least one slave PDM, each slave PDM configured to receive at least one second set of LLR subsets from the input LLR distributor, and, for each encoded codeword node: partially decode one of the at least one second set of LLR subsets to generate a second set of partial computational values. In at least one embodiment, the polar code decoder further comprises an intermediate LLR result combiner configured to, for each encoded codeword node: receive, from the master PDM, a first set of intermediate LLR results, receive, from each one of the at least one slave PDM, a second set of intermediate LLR results, generate the intermediate LLR result sequence, and transmit the intermediate LLR result sequence to the first node decoding pipeline; and a decoded bit aggregator, configured to receive, for each encoded codeword node, the decoded node bit sequence and to generate a decoded codeword bit sequence based on the at least one decoded node bit sequence.

In at least one embodiment, the master PDM further comprises: a first input storage unit configured to receive, from the input LLR distributor, the at least one first set of LLR subsets and store the at least one first set of LLR subsets, a first upper-stage F-G processing unit configured to receive the first set of LLR subsets, partially decode the first set of LLR subsets, and generate the first set of intermediate LLR results; a first output storage unit configured to store at least one of the decoded node bit sequences. In at least one embodiment, each slave PDM comprises: a second input storage unit configured to receive, from the input LLR distributor, the at least one second set of LLR subsets and store the at least one second set of LLR subsets; a second upper-stage F-G processing unit configured to receive and partially decode the second set of LLR subsets, and to generate the second set of intermediate LLR results; and a second output storage unit, configured to store at least another one of the decoded node bit sequences.

The first node decoding pipeline may further comprise a lower-stage F-G processing unit, a specialized decoding unit and a partial sum (PSUM) unit.

The master PDM may further comprise a first scheduler configured to send instruction sequences to the first node decoding pipeline and the first upper-stage F-G processing unit for each encoded codeword node based on values of a codeword node length and a codeword node type of the encoded codeword node.

The master PDM may further comprise a first program storage unit configured to receive and to store the instruction sequences, and to provide the instruction sequences to the first scheduler.

Each one of the at least one slave PDM further comprises a second node decoding pipeline configured to: receive, from the intermediate LLR result combiner, a copy of the intermediate LLR result sequence, and decode the intermediate LLR result sequence to generate a copy of the decoded node bit sequence corresponding to the decoded codeword node.

In at least one embodiment, the second node decoding pipeline comprises a second lower-stage F-G processing unit, a second specialized decoding unit and a second partial sum (PSUM) unit.

The master PDM may further comprise a first scheduler configured to control: the first node decoding pipeline, the first upper-stage F-G processing unit, the second node decoding pipeline, and the second upper-stage F-G processing unit.

The master PDM may comprise a first scheduler configured to control the first node decoding pipeline and the first upper-stage F-G processing unit, and each one of the at least one slave PDM may further comprise a second scheduler configured to control the second node decoding pipeline and the second upper-stage F-G processing unit, the second scheduler being synchronized with the first scheduler.

The master PDM may further comprise a first program storage unit configured to receive and to store instruction sequences, and to transmit the instruction sequences to the first scheduler; and each one of the at least one slave PDM may further comprise a second program storage unit configured to receive and to store the instruction sequences, and to transmit the instruction sequences to the second scheduler.

In at least one embodiment, the master PDM further comprises a first partial sum (PSUM) storage unit configured to store a first set of PSUM values determined based on the at least one decoded node bit sequence, and the first upper-stage F-G processing unit is configured to receive the first set of PSUM values from the first PSUM storage unit; and each one of the at least one slave PDM further comprises a second PSUM storage unit configured to receive a second set of PSUM values determined based on the at least one decoded node bit sequence, and the second upper-stage F-G processing unit is configured to receive the second set of PSUM values from the second PSUM storage unit.

The polar code decoder may further comprise a first output storage unit located in the master PDM and configured to store a first decoded node bit sequence, the at least one decoded node bit sequence comprising the first decoded node bit sequence and a second decoded node bit sequence; a second output storage unit, the second output storage unit being located in one of the at least one slave PDM, the second output storage unit being configured to store the second decoded node bit sequence; and a decoded results distributor configured to: receive the first decoded node bit sequence and the second decoded node bit sequence from the first node decoding pipeline, transmit the first decoded node bit sequence to the first output storage and transmit the second decoded node bit sequence to the second output storage unit, and transmit the first set of PSUM values determined based on the first decoded node bit sequence to the first PSUM storage, and transmit the second set of PSUM values determined based on the second decoded node bit sequence to the second PSUM storage.

In at least one embodiment, a number of the at least one slave PDM is determined based on a codeword length.

In accordance with another aspect of the present disclosure there is provided a method for polar code decoding, the method comprising: receiving a sequence of channel logarithmic likelihood ratios (LLRs) corresponding to an encoded codeword; generating sets of LLR subsets based on the sequence of channel LLRs; for each codeword node of the encoded codeword, generating a decoded node bit sequence of at least one decoded node bit sequence by: partially decoding a first set of LLR subsets to generate a first set of intermediate LLR results; partially decoding at least one second set of LLR subsets to generate at least one second set of intermediate LLR results; combining the first set of intermediate LLR results and the at least one second set of intermediate LLR results to generate an intermediate LLR result sequence; and decoding the intermediate LLR result sequence by a first node decoding pipeline to generate the decoded node bit sequence; and generating a decoded codeword bit sequence based on at least one decoded node bit sequence.

In at least one embodiment, the method further comprises, for each codeword node: determining a first set of partial sum (PSUM) values based on each one of the at least one decoded node bit sequence, and using the first set of PSUM values to partially decode the first set of LLR subsets; and determining a second set of PSUM values based on each one of the at least one decoded node bit sequence, and using the second set of PSUM values to partially decode the second set of LLR subsets.

In at least one embodiment, the method further comprises controlling the decoding of the intermediate LLR result sequence by the first node decoding pipeline based on values of a codeword node length and a codeword node type of the encoded codeword node.

Combining the first set of intermediate LLR results and the at least one second set of intermediate LLR results to generate the intermediate LLR result sequence may further comprise: accumulating the first set of intermediate LLR results and the at least one second set of intermediate LLR results during a plurality of clock cycles; and generating the intermediate LLR result sequence based on the accumulated the first set of intermediate LLR results and the at least one second set of intermediate LLR results, the intermediate LLR result sequence being generated for transmission during one clock cycle.

In at least one embodiment, at least one decoded node bit sequence comprises a first set of the decoded node bit sequences and at least one second set of the decoded node bit sequences, and, the method further comprises: prior to generating the decoded codeword bit sequence, storing the first set of the decoded node bit sequences in a first output storage, storing the second set of the decoded node bit sequences in a second output storage, the first set of the decoded node bit sequences and the second set of the decoded node bit sequences having been generated by the first node decoding pipeline.

In at least one embodiment, the at least one of decoded node bit sequences comprises a first decoded node bit sequence and at least one second decoded node bit sequence, and, the method further comprises: for each encoded codeword node: synchronously with the decoding of the intermediate LLR result sequence by the first node decoding pipeline, decoding a copy of the intermediate LLR result sequence by at least one second node decoding pipeline, each second node decoding pipeline generating a copy of the decoded node bit sequence; and prior to generating the decoded codeword bit sequence: storing the first decoded node bit sequence in a first output storage, the first decoded node bit sequence being the decoded node bit sequence generated by the first node decoding pipeline; and storing each one of the at least one second decoded node bit sequence in a second output storage, each one of the at least one second decoded node bit sequence being the copy of the decoded node bit sequence generated by the second node decoding pipeline.

The method may further comprise controlling the decoding of the intermediate LLR result sequence by the first node decoding pipeline and the second node decoding pipeline based on values of a codeword node length and a codeword node type of each codeword node.

Implementations of the present disclosure each have at least one of the above-mentioned objects and/or aspects, but do not necessarily have all of them. It should be understood that some aspects of the present disclosure that have resulted from attempting to attain the above-mentioned object may not satisfy this object and/or may satisfy other objects not specifically recited herein.

Additional and/or alternative features, aspects and advantages of implementations of the present disclosure will become apparent from the following description, the accompanying drawings and the appended claims.

BRIEF DESCRIPTION OF THE FIGURES

Further features and advantages of the present disclosure will become apparent from the following detailed description, taken in combination with the appended drawings, in which:

FIG. 4 depicts a non-limiting example of a layout of an LLR storage in an input storage unit of the master PDM of the PCD of FIG. 2, in accordance with various embodiments of the present disclosure;

FIG. 5 schematically illustrates a timing diagram of processing of LLRs of a 32-kbit-codeword by a first upper-stage F-G processing unit of the master PDM of the PCD of FIG. 2, in accordance with various embodiments of the present disclosure;

FIG. 8A depicts a decoded nodes storage layout and a sequence of retrieving of data from output storage units of PDMs by a decoded bit aggregator, in accordance with at least one embodiment of the present disclosure;

FIG. 8B depicts a timing diagram illustrating a method for aggregating of decoded node bit sequences of a 32-kbit-codeword, where the decoded nodes were stored in accordance with FIG. 8A;

Figure 1:
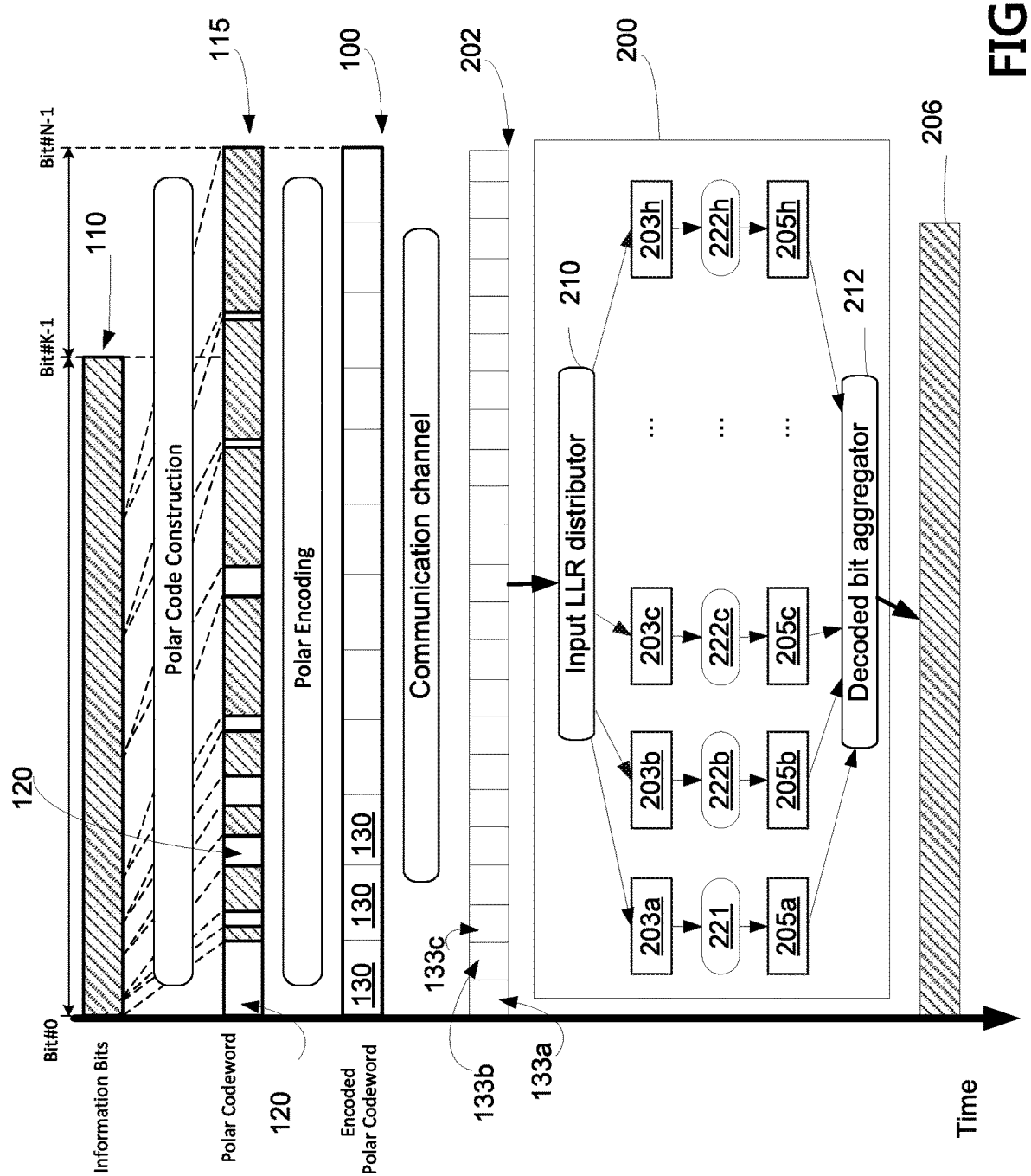
FIG. 1 illustrates encoding of an encoded polar codeword and decoding of the encoded polar codeword using various embodiments of apparatuses and methods as described herein.

It is to be understood that throughout the appended drawings and corresponding descriptions, like features are identified by like reference characters. Furthermore, it is also to be understood that the drawings and ensuing descriptions are intended for illustrative purposes only and that such disclosures do not provide a limitation on the scope of the claims.

DETAILED DESCRIPTION

The instant disclosure is directed to address at least some of the deficiencies of the current polar decoders. In particular, the instant disclosure describes embodiments of a polar decoder (also referred to herein as a "polar code decoder") and a method for decoding polar codes adapted for codewords with various code rates and codeword lengths. Some embodiments of the polar decoder and the method, as described herein, may be used in high-throughput-per-silicon-area applications. The polar decoder as described herein may keep high throughput while decoding long codewords. The polar decoder as described herein may be used, as a non-limiting example, in wireless communications and in optical communications.

Throughout the present disclosure, the terms "node" and "codeword node" refer to a portion of a codeword having several consecutive bits of the codeword. The number of bits in the node, referred to as "node length", may vary. Various node types may be defined depending on the number of frozen bits in the node and their location with regards to information bits of the node.

As used herein, the term "logarithmic likelihood ratio" or "LLR" refers to a multiple-bit number associated with each bit of the codeword. LLRs may also be referred to as "alpha value" for the polar decoder.

LLR represents a probability of a bit being either "0" or "1". A large absolute value of LLR means a strong probability that the transmitted bit is received as "1" or as "0". A sign of LLR indicates the bit polarity (decoded as a "1" or as a "0"). When the absolute value of LLR is "0", this signifies that the estimation of the corresponding bit is unreliable. When the absolute value of LLR is infinite, this signifies that the estimate of the corresponding bit is highly reliable.

As noted above, the term "codeword type" refers to a set of characteristics of a codeword. Such characteristics may include, for example, a codeword length defined by the number of bits N of the codeword, a number of information bits K in the codeword, and a polar code construction method that had been used to encode the codeword. The polar code construction method is determined by positions of K information bits within N codeword bits.

As used herein, the term "32-kbit-codeword" refers to a codeword having the codeword length of N=32 kilobits (kbits). As used herein, the term "16-kbit-codeword" refers to a codeword having the codeword length of N=16 kbits. As used herein, the term "8-kbit-codeword" refers to a codeword having the codeword length of N=8 kbits. As used herein, the term "4-kbit-codeword" refers to a codeword having the codeword length of N=4 kbits.

FIG. 1 illustrates encoding of an encoded polar codeword 100 (also referred to herein as "codeword 100"). FIG. 1 also illustrates decoding of the codeword 100 using apparatuses and methods as described herein, in accordance with various embodiments of the present disclosure.

The codeword 100 is generated by a polar encoder from information bits 110. A set of initial information bits 110 has K bits. The polar codeword 100 has N bits from which there are (N−K) frozen bits 120.

It should be noted that N and K are integers. N may be a power of 2, or a power of any other integer. The other integer may be equivalent to a size of a polar kernel used to generate a polar code matrix of a size of N×N. For example, when N is a power of 2, $N=2^m$, where m is an integer. For example, N may be 256, 512, 1024, etc.

Using different polar construction methods, the set of initial information bits 110 and the frozen bits 120 are aggregated into a polar codeword 115, as schematically illustrated in FIG. 1. The polar codeword 115 is then encoded using the polar code matrix to generate the encoded polar codeword 100.

Each bit of the codeword 100 may be represented with a codeword channel LLR. The codeword 100 may be represented with a sequence of channel LLRs 202. The sequence of channel LLRs 202 comprises LLR subsets 133a, 133b . . . 133h of codeword channel LLRs (disproportionally depicted in FIG. 1). For example, each LLR subset 133a, 133b . . . 133h may have 4 LLRs grouped together. The LLR subsets 133a, 133b . . . 133h may be grouped into sets of LLR subsets 203a, 203b . . . 203h as described herein below.

A polar code decoder (PCD) 200 as described herein comprises a set of polar decoder modules (PDM) 221, 222b, 222c . . . 222h. In the PCD 200, sets of LLR subsets 203a, 203b . . . 203h are distributed to PDMs 221, 222b, 222c . . . 222h of the PCD 200 as described herein below. Then, LLR subsets 203a, 203b . . . 203h are processed by PDMs 221, 222b, 222c . . . 222h, as described below. Each PDM may receive one or more sets of LLR subsets.

PDMs 221, 222b, 222c . . . 222h generate decoded bit sequences (not depicted in FIG. 1). A decoded bit aggregator 212 then receives sets of decoded bit sequences 205a, 205b . . . 205h from all PDMs 221, 222b, 222c . . . 222h and generates a decoded codeword bit sequence 206 (also referred to herein as a "decoded codeword 206").

Figure 2:
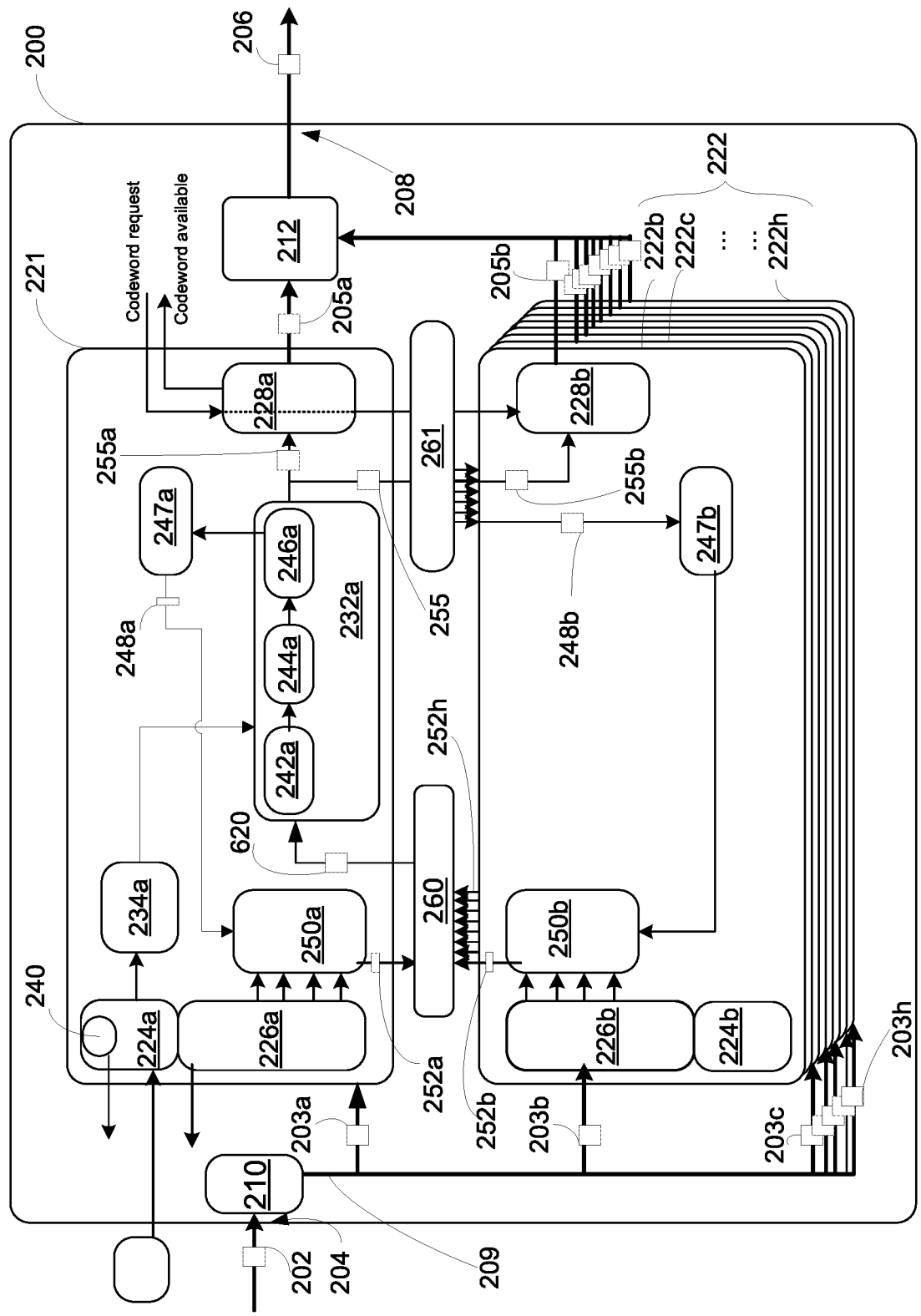
FIG. 2 depicts a block diagram of a polar code decoder (PCD), in accordance with various embodiments of the present disclosure.

FIG. 2 depicts a block diagram of PCD 200, in accordance with various embodiments of the present disclosure. In FIG. 2, PCD 200 is configured to receive the sequence of channel LLRs 202 of encoded codeword 100 at a decoder input 204, and to generate a decoded codeword bit sequence 206 at a decoder output 208.

PCD 200 comprises an input LLR distributor 210, decoded bit aggregator 212, a master polar decoder module (PDM) 221 and one or more slave PDMs 222.

It should be noted that master PDM 221 and one or more slave PDMs 222 are also referred to herein collectively as "PDMs 221, 222". The master PDM 221 is also referred to herein as a "first PDM 221". The one or more slave PDMs 222 may comprise a second PDM 222b, a third PDM 222c, a fourth PDM 222d, and other slave PDMs 222. It should be understood that PCD 200 may have any number of slave PDMs 222.

Still referring to FIG. 2, the master PDM 221 comprises a first program storage unit 224a, a first input storage unit 226a, and a first output storage unit 228a. The master PDM 221 also comprises a first scheduler 234a and a first codeword node decoding pipeline 232a. The slave PDM 222b has a second program storage unit 224b, a second input storage unit 226b, and a second output storage unit 228b. It should be understood that other slave PDMs 222c . . . 222h have the identical hardware as second (slave) PDM 222b.

Each of the first and second program storage units 224a, 224b, first and second input storage units 226a, 226b, and first and second output storage units 228a, 228b are storage elements configured to store data. The first and second input storage units 226a, 226b, and first and second output storage units 228a, 228b may be data buffers configured to store data temporarily.

The storage element may be, for example, a memory, a flip flop, a latch, etc. The first program storage 224a may be configured to communicate with an external controller (not depicted). The external controller may add, delete or replace a decoding program 240 in first program storage unit 224a. In some embodiments, the external controller may add, delete or replace a copy of the decoding program 240 in second program storage unit 224b.

The first program storage unit 224a stores decoding program 240. The decoding program 240 is a computer program with instructions. The decoding program 240 is loaded into first program storage 224a before the encoded codeword is processed. The decoding program 240 comprises one or more sequences of instructions (also referred to herein as an "instruction sequences"). Each instruction sequence is based on an encoded codeword node of the encoded codeword that is being decoded. In particular, the instruction sequence is based on the codeword node length and the codeword node type of the encoded codeword node.

In some embodiments, each instruction sequence corresponding to one codeword node may comprise the codeword node length and the codeword node type of the encoded codeword node. In some embodiments, the instruction sequence may comprise additional information such as, for example, a bit index of a first bit of the codeword node in the codeword. The first program storage 224a is configured to store the instruction sequence(s). In some embodiments, the second program storage 224b stores a copy of the instruction sequence(s).

Referring also to FIG. 1, each codeword node 130 may have any number of bits. For example, one codeword node may have 1 bit or hundreds of bits. When one codeword node has more than one bit, the bits of that codeword node are decoded simultaneously. A type of decoding to perform on the bits of one codeword node corresponds to the codeword node type and codeword node length.

The decoding program 240 may be adapted to any type of the codeword, as long as the codeword length N used in the decoding program 240 is equal to or less than a maximum codeword length supported by the hardware implementation of the PCD 200. As discussed below, such maximum codeword length may depend on a number of hardware parameters, including, for example, a number of PDMs in PCD 200.

The PCD 200 may be configured to execute one decoding program 240 at a time. One decoding program 240 corresponds to a specific combination of codeword length N, code rate R and polar code construction method. There may be an infinite number of such combinations of codeword length, code rate and polar code construction method. A specific decoding program 240 may be provided for decoding a codeword of a first codeword type having length N1, a code rate R1, and a code construction method C1. In some embodiments, in order to decode a codeword of a second codeword type having second length N2 and a second code rate R2, the decoding program 240 may be replaced with a second decoding program (not depicted).

In some embodiments, an external memory (not depicted) may store various decoding programs 240. Such external memory may be, for example, a read-only memory (ROM). The external memory may be located in PCD 200. Alternatively, the external memory may be located separately from PCD 200 and may be operatively connected to PCD 200. The external memory may transfer one of decoding programs 240 to PCD 200. Before PCD 200 may start decoding a codeword, PCD 200 may receive access to decoding program 240 or to data on how to generate the decoding program 240.

In at least one embodiment, a new decoding program 240 for a codeword of the second codeword type may be generated while the PCD 200 decodes the codeword of the first codeword type. The decoding program 240 may be generated in software (for example, in C code) and transferred to an application-specific integrated circuit (ASIC) using an interface. The decoding program 240 may then be loaded to PCD 200. It should be understood that the new decoding program 240 may be loaded while the previous decoding program 240 is still being executed at PCD 200. The new decoding program 240 may then replace the previous decoding program 240.

In some embodiments, decoding program 240 may be generated in hardware by a dedicated hardware logic located outside of PCD 200. In such implementation, the memory occupied by decoding program 240 in program storage 224 and the number of instruction sequences provided by decoding program 240 may be limited by hardware parameters of first program storage 224a.

In some embodiments, PCD 200 may operate without first program storage 224a and individual instructions of the decoding program 240 may be loaded directly from an external storage (not depicted). In such embodiments, the length of the decoding program 240 may be unlimited.

In operation, input LLR distributor 210 receives the sequence of channel LLRs 202 of codeword 100. In a wireless system, the sequence of channel LLRs 202 may be received from a demodulator module (not depicted). The input LLR distributor 210 dispatches sets of LLR subsets 203a, 203b . . . 203h to PDMs 221, 222.

The maximum bit length of codeword 100 that may be decoded by PDMs 221, 222 is defined by hardware logic elements of PDMs 221, 222, as described herein below. For example, each one of PDMs 221, 222 may decode one LLR subset of a length of 4096 bits (so-called "4 kbits").

Referring again to FIG. 2, input storage units 226a, 226b comprise storage element(s) which store(s) sets of LLR subsets 203a, 203b . . . 203h before decoding. Each input storage unit 226a, 226b may comprise, for example, register elements.

When current LLRs are not required anymore by PCD 200 and new LLRs may be accepted, input storage units 226a, 226b may send an indication of a "decoder ready" status to an upstream module. Such upstream module may be, for example, a demodulator module. The input storage units 226a, 226b may thus request a new channel LLRs sequence 202 corresponding to a new encoded codeword 100. The input storage units 226a, 226b then store new LLR subsets 203a, 203b . . . 203h of the encoded codeword 100.

The sequence of channel LLRs 202 may also be stored in an external memory and dispatched to PCD 200 when PCD 200 becomes available to receive another codeword. It should be understood that data flow before and after the PCD 200 may be determined by application(s) and system specifications.

After decoding of a current codeword 100 is completed, the decoded codeword bit sequence 206 is transmitted out of PCD 200. In some embodiments, a status of input storage units 226a, 226b may be set back to "decoder ready" and a new set of LLRs corresponding to another codeword may be loaded to input storage units 226a, 226b after decoding of the current codeword 100 has been completed.

An LLR distribution method described below may be used to distribute sets of LLRs subsets 203a . . . 203h to input storage units 226a, 226b. The LLR distribution method may be specific to the codeword length N.

Figures 3A, 3B:
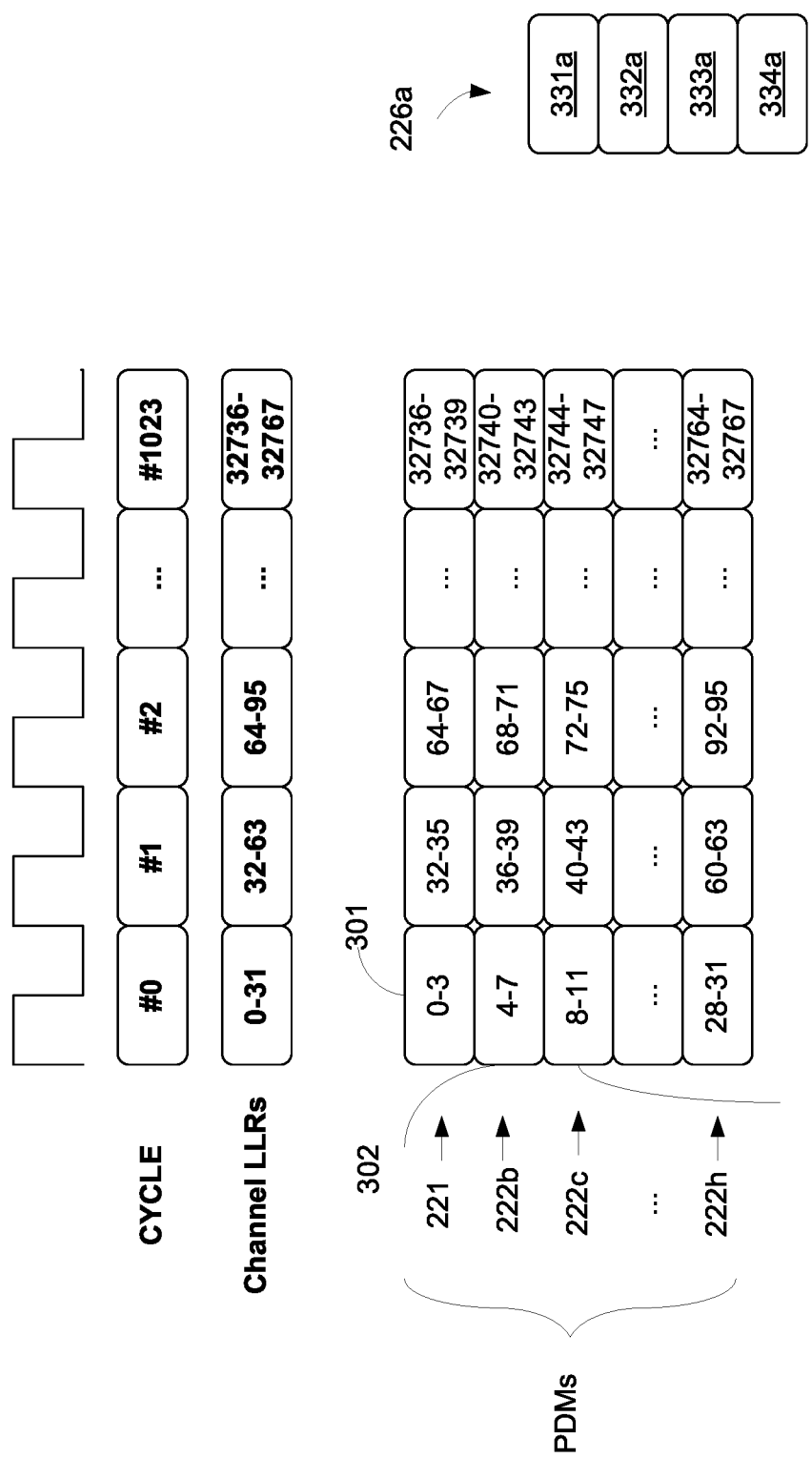
FIG. 3A schematically illustrates a timing diagram of a method of distribution of sets of logarithmic likelihood ratios (LLRs) subsets of a codeword with N=32 kilobits (kbits) to polar decoder modules (PDMs) of the PCD of FIG. 2, in accordance with various embodiments of the present disclosure.
FIG. 3B schematically depicts an input storage unit of a master PDM of the PCD of FIG. 2, in accordance with various embodiments of the present disclosure.

FIG. 3A schematically illustrates a timing diagram of a distribution method of sets of LLRs subsets of a codeword with N=32 kbits to PDMs 221, 222 by input LLR distributor 210, in accordance with various embodiments of the present disclosure.

A codeword with N=32 kbits may be stored in PCD 200 which has 8 PDMs 221, 222. In such non-limiting example, each PDM processes 4 kbits of LLRs, and the number of PDMs that need to be used for decoding may be determined as follows: (32 kbits)/(4 kbits)=8 PDM. The codeword with N=32 kbits may correspond to 32768 channel LLRs. It may take 1024 clock cycles to distribute and receive all channel LLRs corresponding to one codeword, when 32 LLRs are distributed during one clock cycle by input LLR distributor 210.

In order to distribute 32 LLRs per clock cycle to 8 PDMs 221, 222, LLRs may be distributed and stored in LLR subsets, each LLR subset having 4 LLRs. In such non-limiting example, 8 groups of 4 LLRs may be distributed simultaneously during one clock cycle, and each group of 4 LLRs may be distributed to one PDM of PCD 200. A group of LLRs is also referred to herein as an "LLR subset". 8 groups of 4 LLRs (or, in other words, 8 LLR subsets) that are distributed simultaneously during one clock cycle may have all LLRs of one codeword node. As it is described below, LLRs of one codeword node are decoded simultaneously in PCD 200.

At a first clock cycle, depicted as a cycle "#0" in FIG. 3A, channel LLRs that correspond to the $0^{th}$ to $31^{st}$ index bits of the encoded codeword may be distributed to 8 PDMs 221, 222 as follows. A first LLR subset 301 having LLRs that correspond to the $0^{th}$, $1^{st}$, $2^{nd}$ and 3rd index bits of the encoded codeword may be distributed to first PDM 221. A second LLR subset 302 having LLRs that correspond to the $4^{th}$, $5^{th}$, $6^{th}$ and $7^{th}$ index bits of the encoded codeword may be distributed to second PDM 222b. A third LLR subset 303 having LLRs that correspond to the $8^{th}$, $9^{th}$, $10^{th}$, and $11^{th}$ index bits of the encoded codeword may be distributed to the third PDM 222c, etc. An LLR subset having LLRs that correspond to the $28^{th}$, $29^{th}$, $30^{th}$ and $31^{st}$ index bits of the encoded codeword may be distributed to an eighth PDM 222h.

At a second clock cycle, depicted as a "cycle #1" in FIG. 3A, channel LLRs that correspond to the $32^{nd}$ to $63^{rd}$ index bits of the encoded codeword may be distributed to 8 PDMs 221, 222 as follows. An LLR subset having LLRs that correspond to the $32^{nd}$, $33^{rd}$, $34^{th}$, and $35^{th}$ index bits of the encoded codeword may be distributed to the first PDM 221. Another LLR subset having LLRs that correspond to the $36^{th}$, $37^{th}$, $36^{th}$, and $39^{th}$ index bits of the encoded codeword may be distributed to second PDM 222b. An LLR subset having LLRs that correspond to the $60^{th}$, $61^{st}$, $62^{nd}$ and $63^{rd}$ index bits of the encoded codeword may be distributed to the eighth PDM 222h. Distribution of the subsequent LLR subsets to PDMs 221, 222 is depicted in FIG. 3A.

As it can be seen from FIG. 3A, in such LLR distribution method each PDM 221, 222 receives LLR subsets that are not consecutive with respect to bit index of codeword. For example, first PDM 221 may receive LLRs 0-3, 32-35, 64-67, and 96-99. The timing diagram of FIG. 3A may be implemented by PCD 200 when a bus 209 between input LLR distributor 210 and input storage units 226a, 226b (depicted in FIG. 2) transmits 32 LLRs per clock cycle.

In some embodiments, the bus 209 may have a larger capacity. In such embodiments, each one of PDMs 221, 222 may have input storage units that may receive, at each clock cycle, several LLR subsets. The input storage units of the PDMs may have any number of input storage subunits that may receive and store, simultaneously, several LLR subsets. For example, the bus 209 may transmit 128 LLRs per clock cycle. In such non-limiting example, each one of PDMs 221, 222 may have input storage units that may receive simultaneously, at each clock cycle, four LLR subsets, each LLR subset having 4 LLRs.

FIG. 3B schematically depicts input storage unit 226a of master PDM 221, in accordance with various embodiments of the present disclosure. The input storage unit 226a in FIG. 3B has four input storage subunits 331a, 332a, 333a, 334a. It should be understood that one physical storage may be used to comprise all four input storage subunits 331a, 332a, 333a, 334a. In some embodiments, the storage subunits 331a, 332a, 333a, 334a may be separated logically, but not physically.

Similarly, second input storage unit 226b may have four input storage subunits. Other input storage units of the other PDMs may also have, for example, four input storage subunits. Each LLR subset may be distributed to one storage subunit of one PDM at each clock cycle.

Figure 3C:
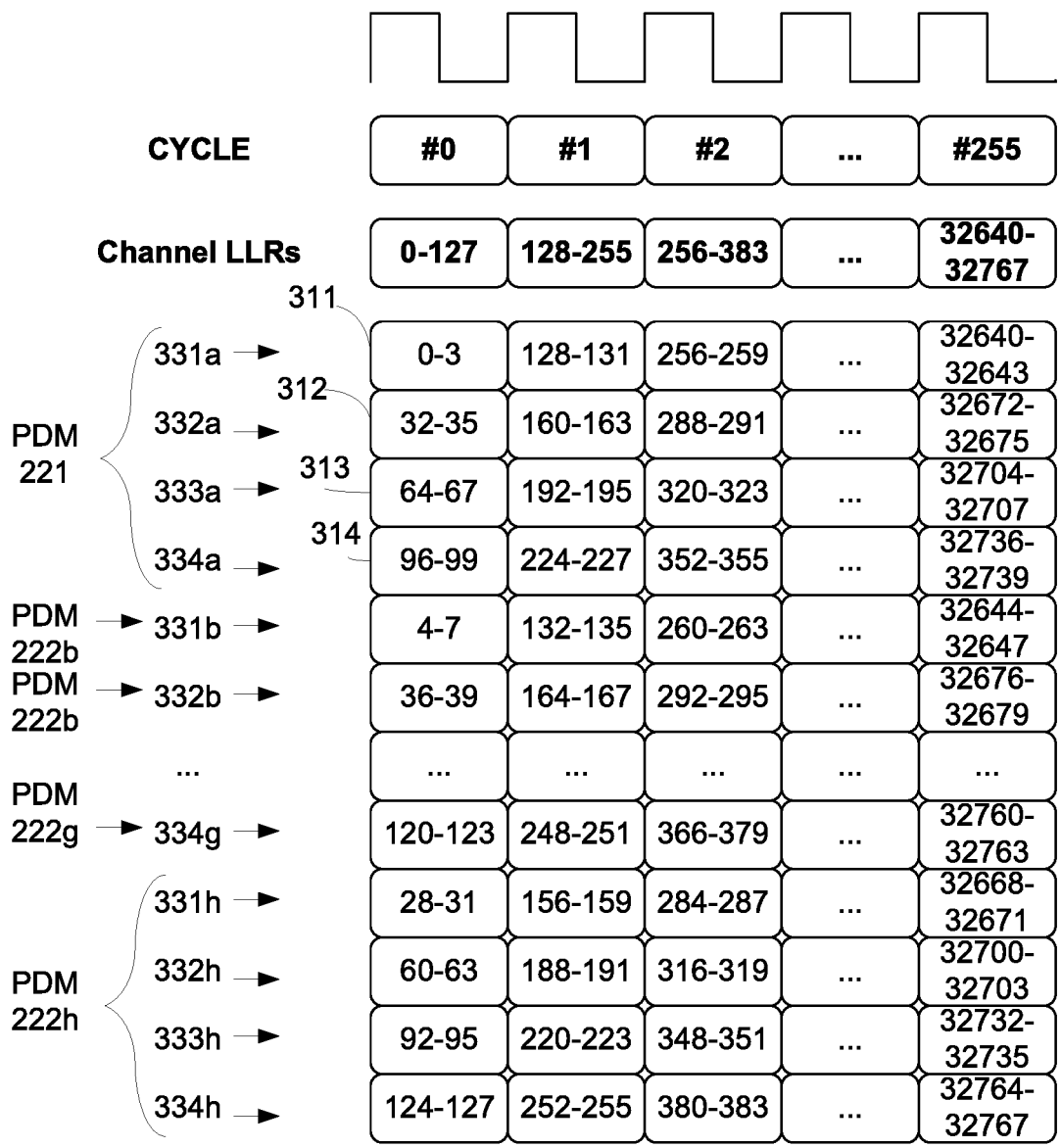
FIG. 3C schematically illustrates a timing diagram of an alternative embodiment of the method of distribution of sets of LLR subsets to PDMs of the PCD of FIG. 2, in accordance with various embodiments of the present disclosure.

FIG. 3C schematically illustrates a timing diagram of an alternative embodiment of the LLR distribution method, in accordance with various embodiments of the present disclosure. FIG. 3C illustrates the distribution method using a non-limiting example of the 32-kbit-codeword, when the bus 209 is adapted to transmit 128 LLRs per clock cycle, in accordance with various embodiments of the present disclosure.

In FIG. 3C, second input storage unit 226b has four input storage subunits 331b, 332b, etc. Other input storage units of the other PDMs also have four input storage subunits. One LLR subset 311, 312, 313, or 314 is distributed to one storage subunit of one PDM at each clock cycle.

Table 1 depicts bit indices of the 32-kbit-codeword which correspond to LLRs distributed to input storage units 226a, 226b using the distribution method illustrated in FIG. 3C.

If the bus 209 transmits 128 LLRs per clock cycle, PCD 200 may use eight PDMs 221, 222b . . . 222h, each having four input storage subunits 331a, 332a, 333a, 334a . . . 331h, 332h, 333h, 334h. In the distribution method of LLRs, all input storage subunits 331a, 332a . . . 334h of all PDMs are filled in simultaneously at each clock cycle.

For the 32-kbit-codeword, LLRs are distributed such that each input storage subunit receives and stores 4 LLRs (equivalent to one LLR subset) per clock cycle. In order to distribute all LLRs of the 32-kbit-codeword, 128 clock cycles may be used if the bus 209 transmits 128 LLRs per clock cycle. The LLRs are then temporarily stored in input storage subunits 331a . . . 331h, 332a . . . 332h, 333a . . . 333h, 334a . . . 334h.

As can be seen in Table 1 and FIG. 3C, LLR subsets are distributed to input storage subunits non-sequentially. A first LLR subset (for example, corresponding to bit indices 0-3 of the codeword) is distributed to the first input storage subunit 331a of the first input storage unit 226a of the master PDM 221. A second LLR subset, which follows the first LLR subset in the sequence of LLRs 202 of the encoded codeword, is the LLR subset that corresponds to bit indices 4-7. The second LLR subset is distributed to the first input storage subunit 331b of the second input storage unit 226b of the second PDM 222b, etc.

In order to distribute the LLR subsets, the input LLR distributor 210 may determine a number of LLRs in each LLR subset 203a . . . 203h. The number of LLRs in each LLR subset 203a . . . 203h may be expressed as follows:

$$\frac{\text{(bus capacity)}}{\text{(number of } PDMs) * \text{(number of input storage subunits per } PDM)} \quad (1)$$

For a 32-kbit-codeword, the number of LLRs in each LLR subset may be 4 if there are 4 input storage subunits in each PDM of 8 PDMs. Each LLR may have 4 bits. For a 16-kbit-codeword, the number of LLRs in each LLR subset may be 8 if there is 1 input storage subunit in each one of 4 PDMs.

The input LLR distributor 210 divides LLR sequence of the codeword into LLR subsequences based on the determined number of LLRs in each set of LLR subsets 203a . . . 203h. Each subsequence is then divided into LLR subsets based on the determined length of the LLR subsets.

For a PCD 200 which has 4 input storage subunits at each PDM 221, 222, a set of four LLR subsets 311, 312, 313, 314 may be distributed per one clock cycle. Referring to a non-limiting example of LLR distribution method depicted in FIG. 3C, all LLR subsets of a first LLR subsequence (corresponding to codeword bits 0 . . . 31) may be distributed simultaneously to the first input storage subunits of each PDM of PCD 200. All LLR subsets of a second LLR subsequence (corresponding to codeword bits 32 . . . 63) may be distributed simultaneously to the second input storage subunits of each PDM of PCD 200. All LLR subsets of a third LLR subsequence (corresponding to codeword bits 64 . . . 95) may be distributed simultaneously to the third input storage subunits of each PDM of PCD 200. All LLR subsets of a fourth LLR subsequence (corresponding to codeword bits 96 . . . 127) may be distributed simultaneously to the fourth input storage subunits of each PDM of PCD 200.

In FIG. 3C, all first input storage subunits are filled in with LLR subsets that correspond to consecutive sets of bit indices of the codeword. Thus, for 32-kbit-codeword, at a first cycle (cycle #0), all first input storage subunits 331a . . . 331h are filled in with LLR subsets that correspond to 0-31 bits of the codeword. During the same cycle, all second input storage subunits are filled in with LLR subsets that correspond to 32-63 bits of the codeword, etc.

Using such LLR distribution method may help to improve the efficiency of decoding by PCD 200. Distributing the LLRs subsets non-sequentially may help to optimize the loading of the channel LLRs into corresponding upper-stage F-G processing units as described herein below.

FIG. 4 depicts a non-limiting example of a layout of LLR storage in an input storage unit 226a of master PDM 221 and codeword bit indices that correspond to LLRs that are stored therein, in accordance with various embodiments of the present disclosure.

The LLRs may be stored in the input storage unit 226a in columns and rows. For a 32-kbit-codeword, the input storage subunit may store 256×4 LLR subsets. Such 256×4 LLR subsets may be organized, for example, in 8 rows and 32 subset columns (in other words, 128 LLRs per row). For example, each storage subunit may receive and store 1024 LLR values. Slave PDMs may have a similar layout of LLR storage in input storage units 226b.

Table 2 depicts bit indices of a 16-kbit-codeword which correspond to LLRs distributed to input storage units 226a, 226b using the LLR distribution method described above. The PCD 200 may use four PDMs 221, 222 in order to decode the 16-kbit-codeword. For the 16-kbit-codeword, input LLR distributor 210 may distribute LLRs such that each input storage subunit 331a . . . 334d may receive and store 8 LLRs per clock cycle. Each input storage subunit 331 may store 128 LLR subsets during 128 clock cycles, each LLR subset corresponding to 8 bits of the 16-kbit-codeword.

Table 3 depicts bit indices of an 8-kbit-codeword which correspond to LLRs distributed to input storage units 226a, 226b using the LLR distribution method described above. The PCD 200 may use two PDMs 221, 222 in order to decode the 8-kbit-codeword. For the 8-kbit-codeword, input LLR distributor 210 may distribute LLRs such that each input storage subunit 331a . . . 334b may receive and store 16 LLRs per clock cycle.

Table 4 depicts bit indices of a 4-kbit-codeword. The bit indices correspond to LLRs distributed to input storage units 226a using the LLR distribution method described above. The PCD 200 may use one PDM 221 in order to decode the 4-kbit-codeword. For the 4-kbit-codeword, LLRs may be distributed such that each input storage subunit 331a, 332a, 333a, 334a of master PDM 221 may receive and store 32 LLRs per clock cycle.

TABLE 1

| | | Codeword's Bit Indices corresponding to LLRs stored | | | |
|---|---|---|---|---|---|
| Clock cycle # | | 0 | 1 | 254 | 255 |
| PDM | Sub-unit | 0 3 | 4 7 | ... 1016 1019 | 1020 1023 |
| 221 | 331a | 0-3 | 128-131 | 32512-32515 | 32640-32643 |
| 221 | 332a | 32-35 | 160-163 | 32544-32547 | 32672-32675 |
| 221 | 333a | 64-67 | 192-195 | 32576-32579 | 32704-32707 |
| 221 | 334a | 96-99 | 224-227 | 32608-32611 | 32736-32739 |
| 222b | 331b | 4-7 | 132-135 | 32516-32519 | 32644-32647 |
| 222b | 332b | 36-39 | 164-167 | 32548-32551 | 32676-32679 |
| 222b | 333b | 68-71 | 196-199 | 32580-32583 | 32708-32711 |
| 222b | 334b | 100-103 | 228-231 | 32612-32615 | 32740-32743 |
| 222c | 331c | 8-11 | 136-139 | 32520-32523 | 32648-32651 |
| 222c | 332c | 40-43 | 168-171 | 32552-32555 | 32680-32683 |
| 222c | 333c | 72-75 | 200-203 | 32584-32587 | 32712-32715 |
| 222c | 334c | 104-107 | 232-235 | 32616-32619 | 32744-32747 |
| 222d | 331d | 12-15 | 140-143 | 32524-32527 | 32652-32655 |
| 222d | 332d | 44-47 | 172-175 | 32556-32559 | 32684-32687 |
| 222d | 333d | 76-79 | 204-207 | 32588-32591 | 32716-32719 |
| 222d | 334d | 108-111 | 236-239 | 32620-32623 | 32748-32751 |
| 222e | 331e | 16-19 | 144-147 | 32528-32531 | 32656-32659 |
| 222e | 332e | 48-51 | 176-179 | 32560-32563 | 32688-32691 |
| 222e | 333e | 80-83 | 208-211 | 32592-32595 | 32720-32723 |
| 222e | 334e | 112-115 | 240-243 | 32624-32627 | 32752-32755 |
| 222f | 331f | 20-23 | 148-151 | 32532-32535 | 32660-32663 |
| 222f | 332f | 52-55 | 180-183 | 32564-32567 | 32692-32695 |
| 222f | 333f | 84-87 | 212-215 | 32596-32599 | 32724-32727 |
| 222f | 334f | 116-119 | 244-247 | 32628-32631 | 32756-32759 |
| 222g | 331g | 24-27 | 152-155 | 32536-32539 | 32664-32667 |
| 222g | 332g | 56-59 | 184-187 | 32568-32571 | 32696-32699 |
| 222g | 333g | 88-91 | 216-219 | 32600-32603 | 32728-32731 |
| 222g | 334g | 120-123 | 248-251 | 32632-32635 | 32760-32763 |
| 222h | 331h | 28-31 | 156-159 | 32540-32543 | 32668-32671 |
| 222h | 332h | 60-63 | 188-191 | 32572-32575 | 32700-32703 |

TABLE 1-continued

| | | Codeword's Bit Indices corresponding to LLRs stored | | | |
|---|---|---|---|---|---|
| Clock cycle # | | 0 | 1 | 254 | 255 |
| PDM | Sub-unit | 0 3 | 4 7 | ... 1016 1019 | 1020 1023 |
| 222h | 333h | 92-95 | 220-223 | 32604-32607 | 32732-32735 |
| 222h | 334h | 124-127 | 252-255 | 32636-32639 | 32764-32767 |

Table 1. Distribution of LLR subsets for a 32-kbit-codeword to input storage subunits 331a . . . 331h, 332a . . . 332h, 333a . . . 333h, 334a . . . 334h of eight PDMs 221 . . . 222h.

TABLE 2

| | | Codeword's Bit Indices corresponding to LLRs stored | | | |
|---|---|---|---|---|---|
| Clock cycle # | | 0 | 1 | 126 | 127 |
| PDM | Sub-unit | 0 7 | 8 15 | ... 1008 1015 | 1016 1023 |
| 221 | 331a | 0-7 | 128-135 | 16128-16135 | 16256-16263 |
| 221 | 332a | 32-39 | 160-167 | 16160-16167 | 16288-16295 |
| 221 | 333a | 64-71 | 192-199 | 16192-16199 | 16320-16327 |
| 221 | 334a | 96-103 | 224-231 | 16224-16231 | 16352-16359 |
| 222b | 331b | 8-15 | 136-143 | 16136-16143 | 16264-16271 |
| 222b | 332b | 40-47 | 168-175 | 16168-16175 | 16296-16303 |
| 222b | 333b | 72-79 | 200-207 | 16200-16207 | 16328-16335 |
| 222b | 334b | 104-111 | 232-239 | 16232-16239 | 16360-16367 |
| 222c | 331c | 16-23 | 144-151 | 16144-16151 | 16272-16279 |
| 222c | 332c | 48-55 | 176-183 | 16176-16183 | 16304-16311 |
| 222c | 333c | 80-87 | 208-215 | 16208-16215 | 16336-16343 |
| 222c | 334c | 112-119 | 240-247 | 16240-16247 | 16368-16375 |
| 222d | 331d | 24-31 | 152-159 | 16152-16159 | 16280-16287 |
| 222d | 332d | 56-63 | 184-191 | 16184-16191 | 16312-16319 |
| 222d | 333d | 88-95 | 216-223 | 16216-16223 | 16344-16351 |
| 222d | 334d | 120-127 | 248-255 | 16248-16255 | 16376-16383 |

Table 2. Distribution of LLR subsets for a 16-kbit-codeword to input storage subunits 331a . . . 331d, 332a . . . 332d, 333a . . . 333d, 334a . . . 334d of four PDMs 221, 222b, 222c, 222d.

TABLE 3

| | | Codeword's Bit Indices corresponding to LLRs stored | | | |
|---|---|---|---|---|---|
| Clock cycle # | | 0 | 1 | 62 | 63 |
| PDM | Sub-unit # | 0 15 | 16 31 | ... 992 1007 | 1008 1023 |
| 221 | 331a | 0-15 | 128-143 | 7936-7951 | 8064-8079 |
| 221 | 332a | 32-47 | 160-175 | 7968-7983 | 8096-8111 |
| 221 | 333a | 64-79 | 192-207 | 8000-8015 | 8128-8143 |
| 221 | 334a | 96-111 | 224-239 | 8032-8047 | 8160-8175 |
| 222b | 331b | 16-31 | 144-159 | 7952-7967 | 8080-8095 |
| 222b | 332b | 48-63 | 176-191 | 7984-7999 | 8112-8127 |
| 222b | 333b | 80-95 | 208-223 | 8016-8031 | 8144-8159 |
| 222b | 334b | 112-127 | 240-255 | 8048-8063 | 8176-8191 |

Table 3. Distribution of LLR subsets for an 8-kbit-codeword to input storage subunits 331a, 331b, 332a, 332b, 333a, 333b, 334a, 334b of two PDMs 221, 222b.

TABLE 4

| | | Codeword's Bit Indices corresponding to LLRs stored | | | |
|---|---|---|---|---|---|
| Clock cycle # | | 0 | 1 | 30 | 31 |
| PDM | Sub-unit | 0 31 | 32 63 | ... 960 991 | 992 1023 |
| 221 | 331a | 0-31 | 128-159 | 3840-3871 | 3968-3999 |
| 221 | 332a | 32-63 | 160-191 | 3872-3903 | 4000-4031 |
| 221 | 333a | 64-95 | 192-223 | 3904-3935 | 4032-4063 |
| 221 | 334a | 96-127 | 224-255 | 3936-3967 | 4064-4095 |

Table 4. Distribution of LLR subsets for a 4-kbit-codeword to input storage subunits 331a, 332a, 333a, 334a of one master PDM 221.

In PCD 200 depicted in FIG. 2, LLRs are partially decoded by upper-stage F-G processing units 250a, 250b, which generate sets of intermediate LLR results. The upper F-G processing units 250a, 250b are located in master PDM 221 and in slave PDMs 222.

A first node decoding pipeline 232a is located in master PDM 221. The first node decoding pipeline 232a receives and then decodes an intermediate LLR result sequence in order to generate decoded node bit sequences. The first node decoding pipeline 232a of master PDM 221 has logic hardware units: a first lower-stage F-G processing unit 242a, a first specialized decoding unit 244a, and a first partial sum (PSUM) unit 246a.

In PCD 200, slave PDMs 222 store LLRs in input storage units 226b, partially decode LLRs in second upper F-G processing units 250b, store some intermediate results, such as partial sum (PSUM) values, and store some of the decoded node bit sequences in output storage units 228b.

The PCD 200 is configured to share multiple upper-stage F-G processing units 250a, 250b for processing of long codewords. Sets of LLR subsets 203a . . . 203h corresponding to one codeword node may be processed simultaneously by several upper-stage F-G processing units 250a, 250b.

The lower-stage F-G processing units 242a, 242b and upper-stage F-G processing units 250a, 250b are configured to execute selectively an F arithmetical operation or a G arithmetical operation.

Based on a bit index associated with the codeword node that is decoded at each clock cycle, first scheduler 234a instructs the first lower-stage F-G processing unit 242a and the first upper-stage F-G processing unit 250a whether to perform F or G operations.

When there are more than 1 PDMs in PCD 200, each second upper-stage F-G processing unit 250b of each slave PDM 222b . . . 222h may have a second scheduler 234b. Second scheduler(s) 234b may run a copy of the program 240 run by the first scheduler 234a. Second scheduler(s) 234b may thus send commands, based on the bit index of codeword node that is being decoded, to second upper-stage F-G processing unit 250b whether to perform F or G operations for the codeword node.

Alternatively, first scheduler 234a of master PDM 221 may send commands to second upper-stage F-G processing unit(s) 250b of each slave PDM 222b . . . 222h. Such commands are also based on the bit index of codeword node that is being decoded.

In operation, upper-stage F-G processing unit 250a receives simultaneously a first LLR (also referred to herein as LLR1) and a second LLR (also referred to herein as LLR2) from input storage unit 226a. In some embodiments, where the input storage unit 226a has a set of input storage subunits, as discussed above, both first and second LLRs are received from the same input storage subunit.

When performing F operation at the F-G tree node, upper-stage F-G processing unit 250a combines two input LLRs, such as LLR1 and LLR2. The upper-stage F-G processing unit 250a generates an LLR result value of F operation as follows:

$$Sign(LLR1)*Sign(LLR2)*Min(|LLR1|,|LLR2|) \quad (2)$$

The upper-stage F-G processing unit 250a also receives a partial sum (PSUM) value 248a from PSUM storage unit 247a described below. The PSUM value 248a, schematically illustrated in FIG. 2, may be used when one of the F-G processing elements (PEs) of the upper-stage F-G processing unit 250a executes G operation. The PSUM value 248a may have 1 bit of data. When decoding the first node (i.e. the node having bit index i=0) of the codeword, the PSUM value 248a is set to "0".

When performing G operation at the F-G processing element, upper-stage F-G processing unit 250a combines two input LLRs, such as LLR1 and LLR2, based on PSUM value 248a. The LLR result value of G operation is:

$$LLR2+LLR1, \text{ if PSUM bit value}=1'b0; \quad (3)$$

$$LLR2-LLR1, \text{ if PSUM bit value}=1'b1. \quad (4)$$

FIG. 5 schematically illustrates a timing diagram of processing of LLRs of the 32-kbit-codeword by the first upper-stage F-G processing unit 250a of master PDM 221, in accordance with various embodiments of the present disclosure.

In FIG. 5, 1024 LLRs from the input storage subunit 331a are transmitted to the upper-stage F-G processing unit 250a. At the output of the upper-stage F-G processing unit 250a, during clock cycle 501 (cycle #0), PDM 221 generates intermediate LLR results corresponding to bit indices 0-3 of the codeword. The second upper-stage F-G processing unit 250b of the second (slave) PDM 222b generates intermediate LLR results corresponding to bit indices 4-7 of the codeword (not depicted in FIG. 5).

During a second clock cycle 502 (cycle #1), the upper-stage F-G processing unit 250a of the master PDM 221 generates intermediate LLR results corresponding to bit indices 32-35 of the codeword. The second upper-stage F-G processing unit 250b of the second (slave) PDM 222b generates intermediate LLR results corresponding to bit indices 36-39 of the codeword. During 4 clock cycles, the 8 PDMs generate a total of 128 LLR results, which a combined by an intermediate LLR result combiner 260 as discussed below.

In some embodiments, the upper-stage F-G processing unit 250a may be optimized for codewords with codeword length of N=1 kbit with 512 PEs on the highest F-G tree processing stage.

The number of F-G tree stages to be implemented in first lower-stage processing units 242a and in first and second upper-stage F-G processing units 250a, 250b depends on the codeword length. To process longer codewords, more F-G tree stages need to be implemented in the upper-stage F-G processing units 250a, 250b.

Table 5 depicts parameters of PCD 200 and parameters of the upper F-G processing units 250a, 250b as a function of the codeword length N, in accordance with various embodiments of the present disclosure.

A maximum codeword length of a codeword, that PCD 200 may process, depends on the number of PDMs 221, 222 in PCD 200. Table 5 provides the number of PDMs in a PCD 200 for processing of a codeword of N bits. Table 5 also provides non-limiting examples of capacity of each PDM in such PCD 200. The capacity of PDM, as referred to herein, refers to a maximum length, in bits, of a portion of the codeword that may be stored in and processed by one PDM.

Examples of number of F-G tree stages on the first upper-stage F-G processing unit 250a, and number of intermediate LLR results that the first upper-stage F-G processing units 250a, 250b may generate, are also provided in Table 5. It should be noted that in at least one embodiment, first and second upper-stage F-G processing units 250a, 250b have identical parameters.

As depicted in Table 5, in order to decode a 4-kbit-codeword, 1 PDM may be used. 5 F-G tree stages may be executed by upper-stage F-G processing unit 250a, 250b with 512 PEs on F-G tree stage #11, 256 PEs on F-G tree stage #10, 128 PEs on F-G tree stage #9, 64 PEs on F-G tree stage #8 and 32 PEs on F-G tree stage #7. The F-G tree stage #7 may generate 128 intermediate LLR results. The upper-stage F-G processing unit 250a, 250b may have 512 PEs on its highest F-G tree stage and may need 4 cycles to complete the computations.

When decoding the 4-kbit-codeword, 32 LLR results per clock cycle may be available at an output of the first upper-stage F-G processing unit 250a following the F-G tree stage #7. After 4 clock cycles, 128 intermediate LLR results may be ready for further processing by the first node decoding pipeline 232a.

In order to decode a 32-kbit-codeword, 8 PDMs may be used. 8 F-G tree stages may be executed by upper-stage F-G processing unit 250a. The upper-stage F-G processing unit 250a, 250b may have 512 PEs on F-G tree stage #14, 256 PEs on F-G tree stage #13, and 4 PEs on F-G tree stage #7 of F-G processing tree.

TABLE 5

| | Upper-Stage F-G Processing Units | | | | | | | | |
|---|---|---|---|---|---|---|---|---|---|
| CW N (kbits) | Number of PDMs | Capacity of PDM (kbits) | Index of Start Stage | Number of LLR pairs from input storage unit | Index of End Stage | Number of LLR results per cycle | Number of Cycles | Number of upper F-G Tree Stages | Number of intermediate LLR Results |
| 4 | 1 | 4 | 11 | 512 | 7 | 32 | 4 | 5 | 128 |
| 8 | 2 | 4 | 12 | 512 | 7 | 16 | 4 | 6 | 128 |
| 16 | 4 | 4 | 13 | 512 | 7 | 8 | 4 | 7 | 128 |
| 32 | 8 | 4 | 14 | 512 | 7 | 4 | 4 | 8 | 128 |
| 64 | 16 | 4 | 15 | 512 | 7 | 2 | 4 | 9 | 128 |
| 128 | 32 | 4 | 16 | 512 | 7 | 1 | 4 | 10 | 128 |
| 256 | 64 | 8 | 17 | 512 | 8 | 1 | 4 | 10 | 256 |

TABLE 5-continued

| | | | | | Upper-Stage F-G Processing Units | | | | |
|---|---|---|---|---|---|---|---|---|---|
| CW N (kbits) | Number of PDMs | Capacity of PDM (kbits) | Index of Start Stage | Number of LLR pairs from input storage unit | Index of End Stage | Number of LLR results per cycle | Number of Cycles | Number of upper F-G Tree Stages | Number of intermediate LLR Results |
| 512 | 128 | 16 | 18 | 512 | 9 | 1 | 4 | 10 | 512 |
| 1024 | 256 | 32 | 19 | 512 | 10 | 1 | 4 | 10 | 1024 |
| 2048 | 512 | 64 | 20 | 512 | 11 | 1 | 4 | 10 | 2048 |
| 4096 | 1024 | 128 | 21 | 512 | 12 | 1 | 4 | 10 | 4096 |

Table 5. Parameters of PCD 200 and parameters of the first upper F-G processing unit 250*a* as a function of the codeword length N.

In some embodiments, the number of PDMs in the PCD 200 may be determined as an integer (round) of (N/4), where N is a number of bits in the codeword. The total number of F-G tree stages in the F-G processing unit is equal to the highest F-G tree stage of the upper-stage F-G processing unit 250*a* as specified in Table 5.

In Table 5, the term "index of start stage" refers to the index of the F-G tree stage which receives the LLRs in the upper-stage F-G processing unit 250*a*, 250*b*. The term "index of the end stage" refers to the index of the F-G tree stage, which transmits the intermediate LLR results from the upper-stage F-G processing unit 250*a*, 250*b* to the lower-stage F-G processing unit 242*a*. By knowing the indices of the start stage and end stage of the upper-stage F-G processing unit 250*a*, 250*b*, one may determine the number of F-G tree stages of the upper-stage F-G processing unit 250*a*, 250*b*. The number of F-G tree stages of the upper-stage F-G processing unit 250*a*, 250*b* may be expressed as:

$$\text{Number of stages} = (\text{index of start stage}) - (\text{index of end stage}) + 1 \quad (5)$$

The index of the start stage of the upper F-G processing unit 250*a*, 250*b* may be determined from the following equation:

$$\text{Index of start stage} = \log_2(N/2) - 1. \quad (6)$$

The index of the end stage of the upper F-G processing unit 250*a*, 250*b* may be determined from the following equation:

$$\text{Index of end stage} = \log_2(\text{decoding pipeline width}). \quad (7)$$

In equation (7), the "decoding pipeline width" is the maximum of bits that may be processed by one decoding pipeline of one PDM. In other terms, the decoding pipeline width is the maximum length of a codeword portion that may be processed by one decoding pipeline of one PDM. For example, the decoding pipeline width may be 128.

By subtracting 1 from the index of end stage in the upper F-G processing unit 250*a*, one may determine a number of F-G tree stages in the lower F-G processing unit 242*a*.

A number of F-G PEs per PDM at the end stage may be expressed as ((decoding pipeline width)/(number of PDMs))/(number of cycles). The number of cycles may be determined as the number of cycles needed for first node decoding pipeline 232*a* of master PDM to decode the codeword node of specific length. For example, the number of cycles may be determined as a number of channel LLR pairs to process (N/2), divided by a number of F-G PEs on the start stage, and divided by a number of PDMs. For example, when the number of F-G processing elements on the start stage is 512, the number of cycles may be determined as ((N/2)/512/(number of PDMs)).

It should be noted that when a codeword has a length of N=128 bit, the channel LLRs are transmitted directly to the 128-bit decoding pipeline, and the upper-stage processing unit 250*a* of master PDM 221 does not participate in decoding of such codeword.

The PCD 200 also has an intermediate LLR result combiner 260. The intermediate LLR result combiner 260 may be physically located on master PDM 221 or on any one of slave PDMs 222. Alternatively, the intermediate LLR result combiner 260 may be located outside of PDMs 221, 222.

The intermediate LLR result combiner 260 is connected to upper-stage F-G processing units 250*a*, 250*b* of master PDM 221 and slave PDMs 222. The first and second upper-stage F-G processing units 250*a*, 250*b* of all PDMs 221, 222, that are used in decoding of the codeword, generate sets of intermediate LLR results 252*a*, 252*b* . . . 252*h*. The sets of intermediate LLR results 252*a*, 252*b* . . . 252*h* are then transmitted to the intermediate LLR result combiner 260.

The intermediate LLR result combiner 260 combines and rearranges the sets of intermediate LLR results 252*a*, 252*b* . . . 252*h* as described below. The intermediate LLR result combiner 260 accumulates the intermediate LLR results during several clock cycles and transmits an intermediate LLR result sequence 620 in one clock cycle to the first node decoding pipeline 232*a*. In addition, the intermediate LLR result combiner 260 may store the sets of intermediate LLR results 252*a*, 252*b* . . . 252*h*.

Figure 6A:
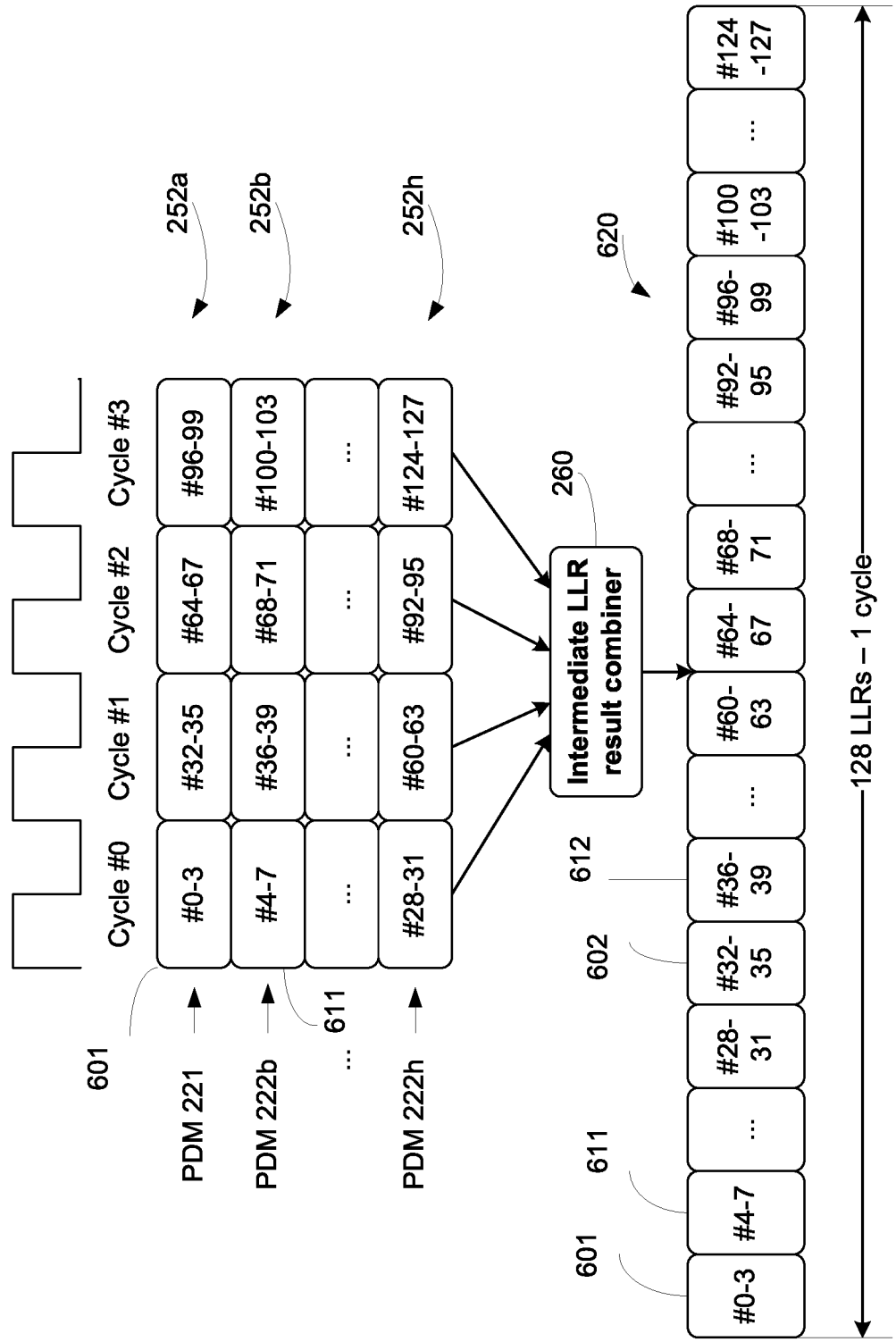
FIG. 6A depicts sets of intermediate LLR results for a 32-kbit-codeword and a non-limiting example of an intermediate LLR result sequence, in accordance with at least one non-limiting embodiment of the present disclosure.

FIG. 6A depicts the sets of intermediate LLR results 252*a*, 252*b* . . . 252*h* as received by intermediate LLR result combiner 260 for a 32-kbit-codeword, in accordance with at least one non-limiting embodiment of the present disclosure. FIG. 6A also depicts the intermediate LLR result sequence 620 generated by the intermediate LLR result combiner 260, in accordance with at least one non-limiting embodiment of the present disclosure.

The intermediate LLR result combiner 260 receives sets of intermediate LLR results 252*a*, 252*b* . . . 252*h* from the upper F-G processing units 250*a*, 250*b* during several clock cycles. For the 32-kbit-codeword, the number of such clock cycles may be 4. The intermediate LLR result combiner 260 then generates the intermediate LLR result sequence 620 based on the sets of intermediate LLR results 252*a*, 252*b* . . . 252*h*.

The intermediate LLR result sequence 620 comprises the sets of intermediate LLR results 252*a*, 252*b* . . . 252*h*. As depicted in FIG. 6A, each PDM 221, 222 transmits one subset of intermediate LLR results 601, 611, per clock cycle. Each subset of intermediate LLR results 601, 602 corresponds to different bit indices of the codeword, as depicted in FIG. 6A.

In the intermediate LLR result sequence 620, the subsets of intermediate LLR results 601, 611 accumulated from PDMs 221, 222 during the first cycle (cycle #0 in FIG. 6A) are arranged sequentially. In other words, each subset of intermediate LLR results 601, corresponding to a first subset of bit indices in the codeword (e.g. bit indices 0-3 in FIG. 6A), is followed by a subset of intermediate LLR results 611 corresponding to a second subset of bit indices of the codeword (e.g. bit indices 4-7 in FIG. 6A) received during the same clock cycle. It should be understood that the first subset of bit indices (e.g. bit indices 0-3 in FIG. 6A) in the codeword is followed by the second subset of bit indices in the codeword (e.g. bit indices 4-7 in FIG. 6A).

Figure 6B:
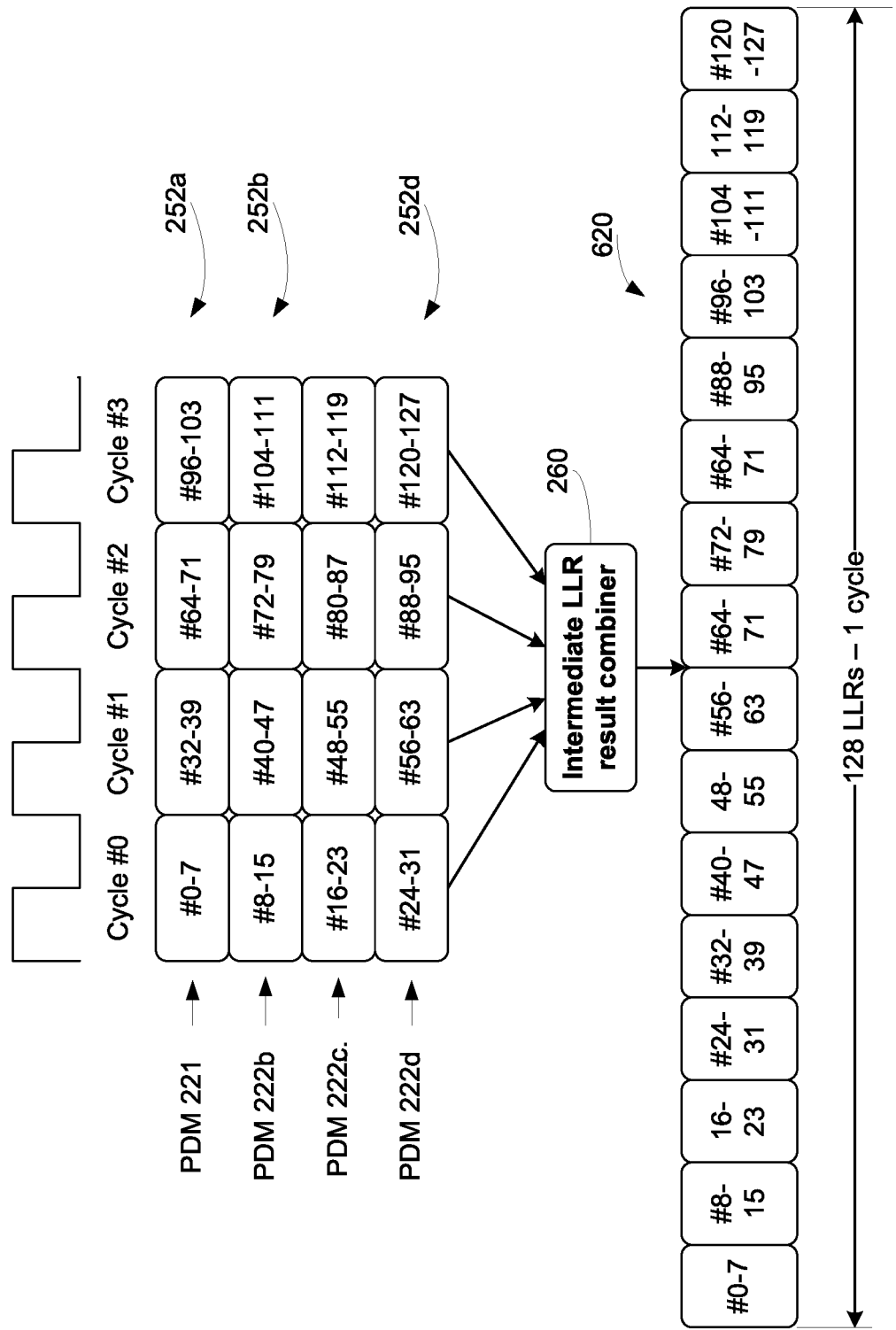
FIG. 6B depicts sets of the intermediate LLR results for a 16-kbit-codeword and another non-limiting example of an intermediate LLR result sequence, in accordance with at least one non-limiting embodiment of the present disclosure.

FIG. 6B depicts the sets of intermediate LLR results 252a, 252b . . . 252d as received by intermediate LLR result combiner 260 for a 16-kbit-codeword, in accordance with at least one non-limiting embodiment of the present disclosure. FIG. 6B depicts another non-limiting example of intermediate LLR result sequence 620 generated by the intermediate LLR result combiner 260, in accordance with at least one non-limiting embodiment of the present disclosure.

Figure 6C:
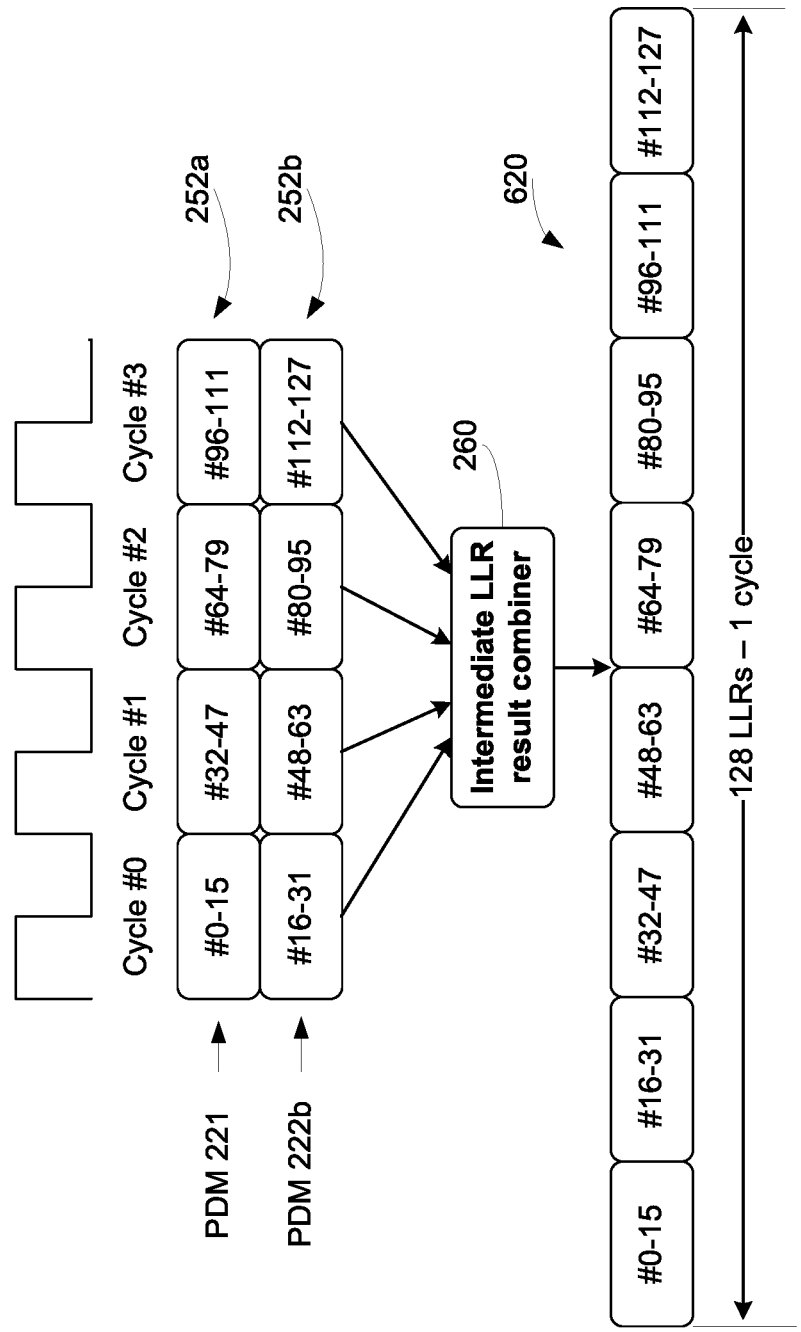
FIG. 6C depicts sets of the intermediate LLR results for an 8-kbit-codeword and another non-limiting example of an intermediate LLR result sequence, in accordance with at least one non-limiting embodiment of the present disclosure.

FIG. 6C depicts the sets of intermediate LLR results 252a, 252b as received by intermediate LLR result combiner 260 for an 8-kbit-codeword, and another intermediate LLR result sequence 620 generated by the intermediate LLR result combiner 260, in accordance with at least one non-limiting embodiment of the present disclosure.

Figure 6D:
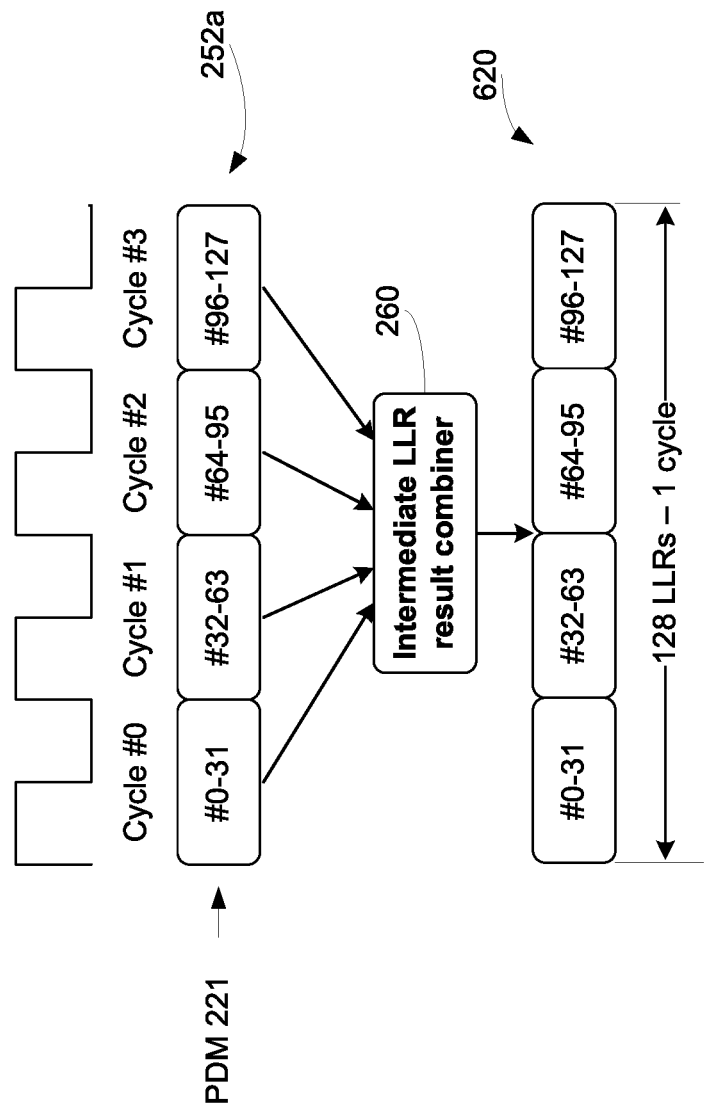
FIG. 6D depicts sets of the intermediate LLR results for a 4-kbit-codeword and another non-limiting example of an intermediate LLR result sequence, in accordance with at least one non-limiting embodiment of the present disclosure.

FIG. 6D depicts the set of intermediate LLR results 252a as received by intermediate LLR result combiner 260 for a 4-kbit-codeword, and another intermediate LLR result sequence 620 generated by the intermediate LLR result combiner 260, in accordance with at least one non-limiting embodiment of the present disclosure.

In the first node decoding pipeline 232a, lower-stage F-G processing unit 242a receives intermediate LLR result sequence 620 from intermediate LLR result combiner 260. Similarly to the upper-stage F-G processing units 250a, 250b, lower-stage F-G processing unit 242a processes the intermediate LLR result sequence 620 and performs F or G arithmetic operations. The F or G arithmetic operations are described by equations (2)-(4) provided above. At each clock cycle, the first lower-stage F-G processing unit 242a receives commands from scheduler 234a that indicate whether F or G operation should be executed. Such commands depend on a bit index of a node being currently executed.

Referring again to FIG. 2, first specialized decoding unit 244a of first node decoding pipeline 232a is configured to execute a decoding logic based on the node type. The first specialized decoding unit 244a executes a second phase of the 3-phase node decoding pipeline 232a: so-called "decoding phase"-.

The decoding node logic executed by first specialized decoding unit 244a comprises combinatorial logic and uses the intermediate LLR result from a stage #X of the F-G tree where X is: X=$\log_2$ (node length).

The specialized decoding unit 244a may be configured to decode partially decoded LLRs received from 242a by using a simplified successive cancellation (so-called "Fast-SSC") method known in the art. Fast-SSC decoding nodes may be, for example: Rate-0 (R0), Rate-1 (R1), Repetition (REP), Bi-repetition (B-REP), and single-bit parity check (SPC) decoding nodes. It should be understood that other decoding algorithms are applicable to the methods and apparatuses described herein.

In some embodiments, node types, corresponding to Fast-SSC decoding nodes, are as follows. Rate-0 (R0) corresponds to a sequence of frozen bits. Rate-1 (R1) corresponds to a sequence of information bits. Repetition (REP) corresponds to a sequence of frozen bits followed by one information bit. Bi-repetition (B-REP) corresponds to a sequence of frozen bits followed by two information bits. Single-bit Parity Check (SPC) corresponds to a sequence of one frozen bit followed by information bits. To further reduce the decoding latency, PCD 200 may also implement custom decoding node logic.

Commands received by first node decoding pipeline 232a for the specialized decoding unit 244a indicate which one of the Fast-SSC decoding codeword nodes need to be used for decoding of the current encoded codeword node. The specialized decoding unit 244a generates decoded bits and transmits them to PSUM unit 246a.

At the third stage of node decoding pipeline 232a, PSUM unit 246a applies N×N polar code matrix to the decoded bits received from specialized decoding unit 244a. PSUM unit 246a combines previously decoded bits with modulo-2 sum and generates PSUM values 248a. In some embodiments, PSUM unit 246a may also store locally the accumulated PSUM results.

In PCD 200, each PDM 221, 222 has a PSUM storage unit 247a, 247b for storing PSUMs values 248a, 248b. The first and the second upper-stage F-G processing units 250a and 250b retrieve PSUMs values 248a, 248b from PSUM storage units 247a, 247b, respectively. As noted above, PSUM values 248a, 248b are then used by upper-stage F-G processing units 250a, 250b when G operation is executed. It should be noted that in master PDM 221, PSUM values are also used by the first lower-stage F-G processing unit 242a when G operation is executed.

Figure 7A:
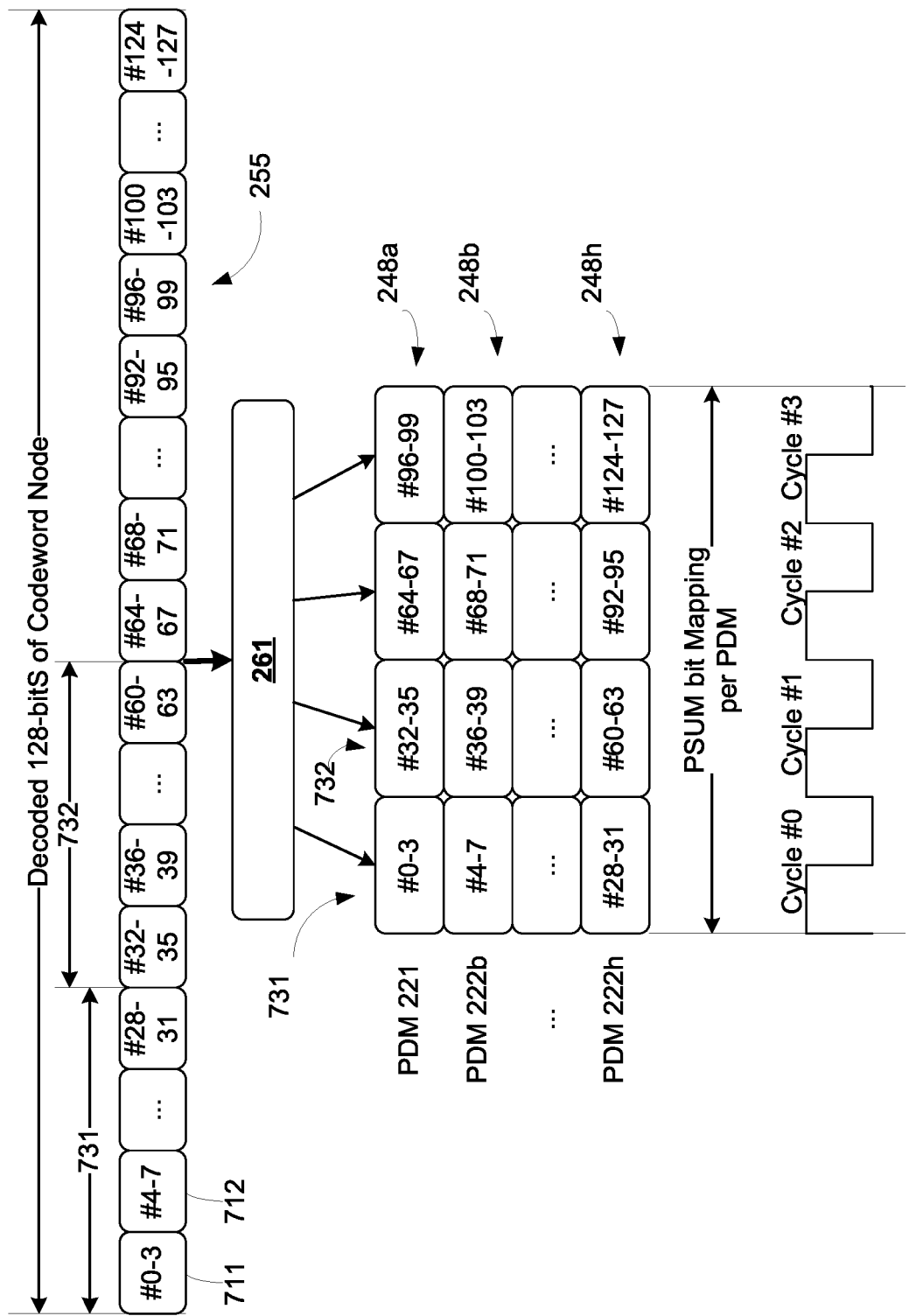
FIG. 7A depicts a decoded node bit sequence for a 32-kbit-codeword, and bit indices of PSUM values, in accordance with at least one non-limiting embodiment of the present disclosure.

FIG. 7A depicts a decoded node bit sequence 255 for a 32-kbit-codeword, and bit indices of PSUM values 720a, 720b, . . . 720h generated by decoded results distributor 261, in accordance with at least one non-limiting embodiment of the present disclosure. The decoded node bit sequence 255 has decoded bit sets that follow the sequence of bit indices of the codeword. For example, a first decoded bit set 711 has decoded bits 0-3. A second bit set 712 has decoded bits 4-7.

The decoded result distributor 261 receives the decoded node bit sequence 255 and transmits sets of PSUM values 248b . . . 248h to PDMs 221, 222. The decoded result distributor 261 divides the received decoded node bit sequence 255 into several sequences of decoded bit sets. The decoded result distributor 261 transmits sets of PSUM values corresponding to decoded bit sets of a first sequence 731 of decoded bit sets simultaneously to all PDMs during one clock cycle. In some embodiments, PSUM unit 246a of first node decoding pipeline 232a may send PSUM values 248a directly to first PSUM storage unit 247a.

Still referring to FIG. 7A, the decoded result distributor 261 then transmits PSUM values corresponding to decoded bit sets of a second sequence 732 of decoded bit sets simultaneously to all PDMs 221, 222 during another clock cycle. In such embodiment, the second sequence 732 of the decoded bit sets follows the first sequence 731 of the decoded bit sets in the decoded node bit sequence 255.

In addition to transmitting PSUM values to PDMs 221, 222, the decoded result distributor 261 also transmits sets of decoded node bit sequences 205a, 205b to first and second output storage units 228a, 228b of the PDMs 221, 222. Each set of decoded node bit sequences 205a, 205b comprises one or more decoded node bit sequences 255a, 255b, respectively.

Figure 7B:
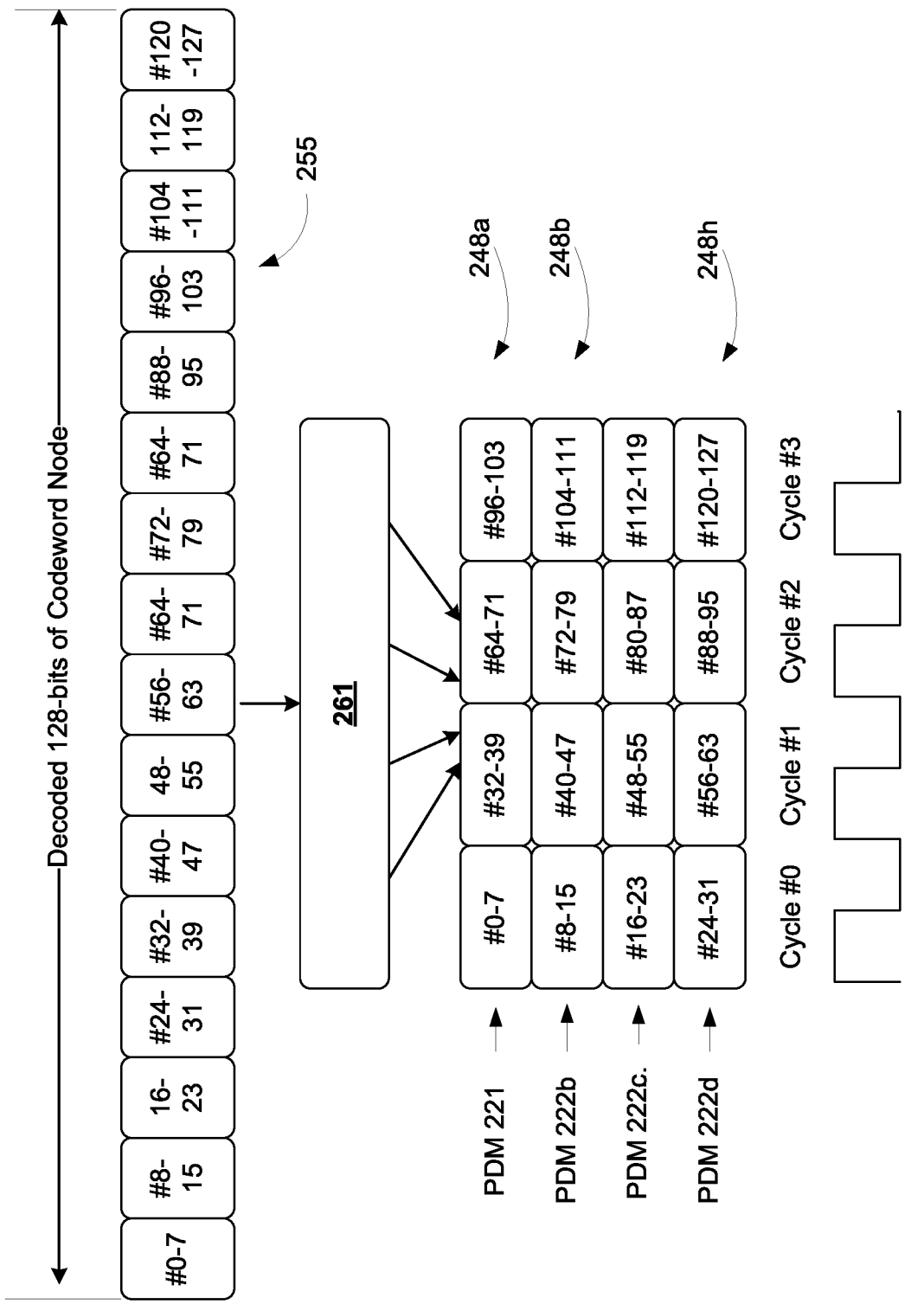
FIG. 7B depicts a decoded node bit sequence for a 16-kbit-codeword, and bit indices of PSUM values, in accordance with at least one non-limiting embodiment of the present disclosure.

FIG. 7B depicts a decoded node bit sequence 255 for a 16-kbit-codeword, and bit indices of PSUM values generated by decoded results distributor 261, in accordance with at least one non-limiting embodiment of the present disclosure.

Figure 7C:
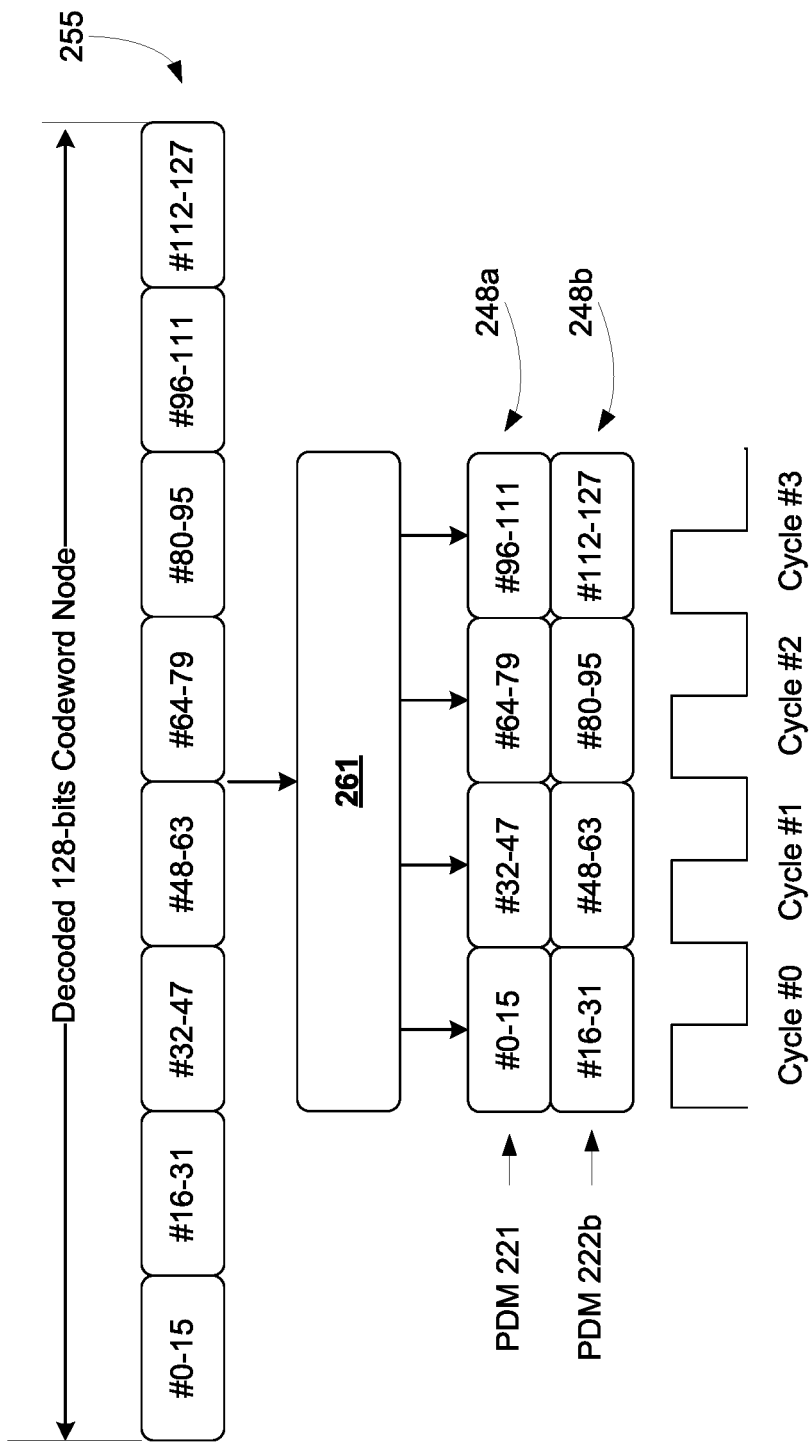
FIG. 7C depicts a decoded node bit sequence for a 8-kbit-codeword, and bit indices of PSUM values, in accordance with at least one non-limiting embodiment of the present disclosure.

FIG. 7C depicts a decoded node bit sequence 255 for an 8-kbit-codeword, and bit indices of PSUM values generated by decoded results distributor 261, in accordance with at least one non-limiting embodiment of the present disclosure.

Figure 7D:
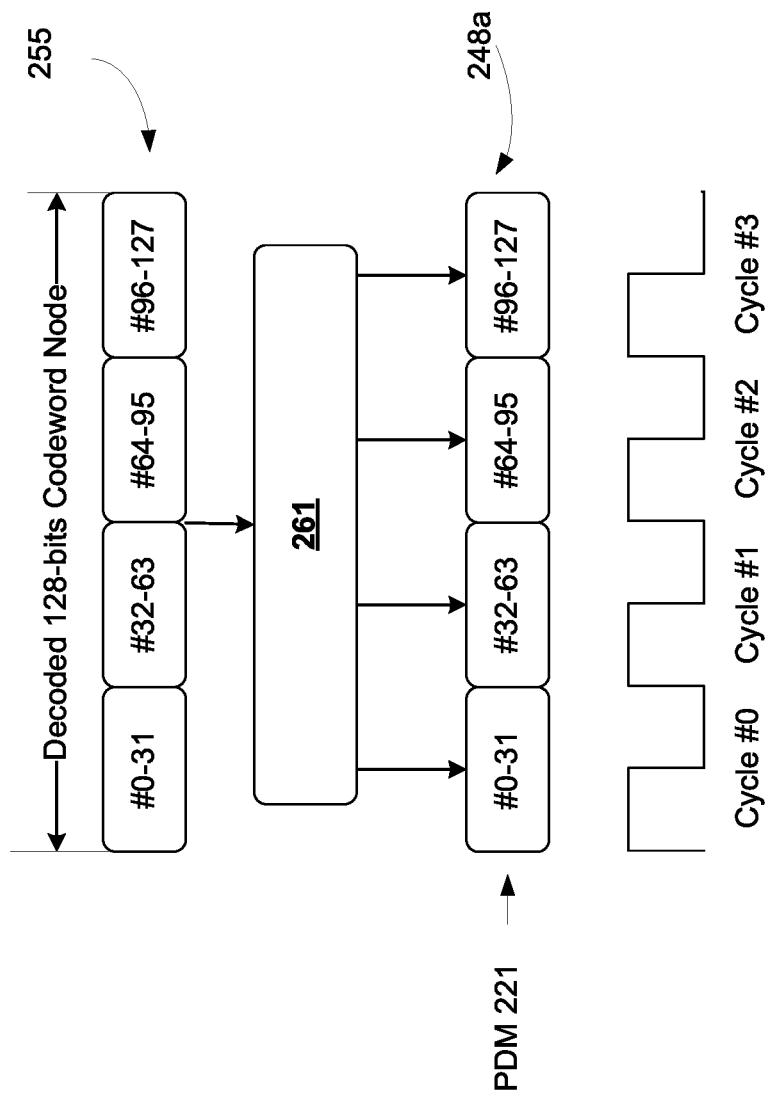
FIG. 7D depicts a decoded node bit sequence for a 4-kbit-codeword, and bit indices of PSUM values, in accordance with at least one non-limiting embodiment of the present disclosure.

FIG. 7D depicts a decoded node bit sequence 255 for a 4-kbit-codeword, and bit indices of PSUM values generated by decoded results distributor 261, in accordance with at least one non-limiting embodiment of the present disclosure.

TABLE 6

| PDM | PSUM Storage Subunit # | PSUM Mapping | | | |
|---|---|---|---|---|---|
| | | 128-bit Node #0 | 128-bit Node #1 | 128-bit Node #254 | 128-bit Node #255 |
| 221 | 0 | 0-3 | 128-131 | 32512-32515 | 32640-32643 |
| 221 | 1 | 32-35 | 160-163 | 32544-32547 | 32672-32675 |
| 221 | 2 | 64-67 | 192-195 | 32576-32579 | 32704-32707 |
| 221 | 3 | 96-99 | 224-227 | 32608-32611 | 32736-32739 |
| 222b | 0 | 4-7 | 132-135 | 32516-32519 | 32644-32647 |
| 222b | 1 | 36-39 | 164-167 | 32548-32551 | 32676-32679 |
| 222b | 2 | 68-71 | 196-199 | 32580-32583 | 32708-32711 |
| 222b | 3 | 100-103 | 228-231 | 32612-32615 | 32740-32743 |
| 222c | 0 | 8-11 | 136-139 | 32520-32523 | 32648-32651 |
| 222c | 1 | 40-43 | 168-171 | 32552-32555 | 32680-32683 |
| 222c | 2 | 72-75 | 200-203 | 32584-32587 | 32712-32715 |
| 222c | 3 | 104-107 | 232-235 | 32616-32619 | 32744-32747 |
| 222d | 0 | 12-15 | 140-143 | 32524-32527 | 32652-32655 |
| 222d | 1 | 44-47 | 172-175 | 32556-32559 | 32684-32687 |
| 222d | 2 | 76-79 | 204-207 | 32588-32591 | 32716-32719 |
| 222d | 3 | 108-111 | 236-239 | 32620-32623 | 32748-32751 |
| 222e | 0 | 16-19 | 144-147 | 32528-32531 | 32656-32659 |
| 222e | 1 | 48-51 | 176-179 | 32560-32563 | 32688-32691 |
| 222e | 2 | 80-83 | 208-211 | 32592-32595 | 32720-32723 |
| 222e | 3 | 112-115 | 240-243 | 32624-32627 | 32752-32755 |
| 222f | 0 | 20-23 | 148-151 | 32532-32535 | 32660-32663 |
| 222f | 1 | 52-55 | 180-183 | 32564-32567 | 32692-32695 |
| 222f | 2 | 84-87 | 212-215 | 32596-32599 | 32724-32727 |
| 222f | 3 | 116-119 | 244-247 | 32628-32631 | 32756-32759 |
| 222g | 0 | 24-27 | 152-155 | 32536-32539 | 32664-32667 |
| 222g | 1 | 56-59 | 184-187 | 32568-32571 | 32696-32699 |
| 222g | 2 | 88-91 | 216-219 | 32600-32603 | 32728-32731 |
| 222g | 3 | 120-123 | 248-251 | 32632-32635 | 32760-32763 |
| 222h | 0 | 28-31 | 156-159 | 32540-32543 | 32668-32671 |
| 222h | 1 | 60-63 | 188-191 | 32572-32575 | 32700-32703 |
| 222h | 2 | 92-95 | 220-223 | 32604-32607 | 32732-32735 |
| 222h | 3 | 124-127 | 252-255 | 32636-32639 | 32764-32767 |

Table 6 depicts bit indices corresponding to PSUM values of nodes that are stored in PSUM storage subunits of various PDMs for decoding of a 32-kbit-codeword, in accordance with at least one embodiment of the present disclosure.

TABLE 7

| PDM | PSUM Storage Subunit # | PSUM Mapping | | | |
|---|---|---|---|---|---|
| | | 128-bit Node #0 | 128-bit Node #1 | 128-bit Node #126 | 128-bit Node #127 |
| 221 | 0 | 0-7 | 128-135 | 16128-16135 | 16256-16263 |
| 221 | 1 | 32-39 | 160-167 | 16160-16167 | 16288-16295 |
| 221 | 2 | 64-71 | 192-199 | 16192-16199 | 16320-16327 |
| 221 | 3 | 96-103 | 224-231 | 16224-16231 | 16352-16359 |
| 222b | 0 | 8-15 | 136-143 | 16136-16143 | 16264-16271 |
| 222b | 1 | 40-47 | 168-175 | 16168-16175 | 16296-16303 |
| 222b | 2 | 72-79 | 200-207 | 16200-16207 | 16328-16335 |
| 222b | 3 | 104-111 | 232-239 | 16232-16239 | 16360-16367 |
| 222c | 0 | 16-23 | 144-151 | 16144-16151 | 16272-16279 |
| 222c | 1 | 48-55 | 176-183 | 16176-16183 | 16304-16311 |
| 222c | 2 | 80-87 | 208-215 | 16208-16215 | 16336-16343 |

TABLE 7-continued

| PDM | PSUM Storage Subunit # | PSUM Mapping | | | |
|---|---|---|---|---|---|
| | | 128-bit Node #0 | 128-bit Node #1 | 128-bit Node #126 | 128-bit Node #127 |
| 222c | 3 | 112-119 | 240-247 | 16240-16247 | 16368-16375 |
| 222d | 0 | 24-31 | 152-159 | 16152-16159 | 16280-16287 |
| 222d | 1 | 56-63 | 184-191 | 16184-16191 | 16312-16319 |
| 222d | 2 | 88-95 | 216-223 | 16216-16223 | 16344-16351 |
| 222d | 3 | 120-127 | 248-255 | 16248-16255 | 16376-16383 |

Table 7 depicts bit indices corresponding to PSUM values of nodes that are stored in PSUM storage subunits of various PDMs for decoding of a 16-kbit-codeword, in accordance with at least one embodiment of the present disclosure.

Table 8 depicts bit indices corresponding to PSUM values of nodes that are stored in PSUM storage subunits of various PDMs for decoding of an 8-kbit-codeword, in accordance with at least one embodiment of the present disclosure.

TABLE 8

| PDM | PSUM Storage Subunit # | PSUM Mapping | | | |
|---|---|---|---|---|---|
| | | 128-bit Node #0 | 128-bit Node #1 | 128-bit Node #62 | 128-bit Node #63 |
| 221 | 0 | 0-15 | 128-143 | 7936-7951 | 8064-8079 |
| 221 | 1 | 32-47 | 160-175 | 7968-7983 | 8096-8111 |
| 221 | 2 | 64-79 | 192-207 | 8000-8015 | 8128-8143 |
| 221 | 3 | 96-111 | 224-239 | 8032-8047 | 8160-8175 |
| 222b | 0 | 16-31 | 144-159 | 7952-7967 | 8080-8095 |
| 222b | 1 | 48-63 | 176-191 | 7984-7999 | 8112-8127 |
| 222b | 2 | 80-95 | 208-223 | 8016-8031 | 8144-8159 |
| 222b | 3 | 112-127 | 240-255 | 8048-8063 | 8176-8191 |

Table 9 depicts bit indices corresponding to PSUM values of nodes that are stored in PSUM storage subunits of various PDMs for decoding of a 4-kbit-codeword, in accordance with at least one embodiment of the present disclosure.

In the embodiments depicted in Tables 6-9, each PSUM storage unit 247a, 247b has four PSUM storage subunits. Each PSUM storage subunit is referred to as PSUM storage subunit 0, 1, 2, 3.

TABLE 9

| PDM | PSUM Storage Subunit # | PSUM Mapping | | | |
|---|---|---|---|---|---|
| | | 128-bit Node #0 | 128-bit Node #1 | 128-bit Node #30 | 128-bit Node #31 |
| 221 | 0 | 0-31 | 128-159 | 3840-3871 | 3968-3999 |
| 221 | 1 | 32-63 | 160-191 | 3872-3903 | 4000-4031 |
| 221 | 2 | 64-95 | 192-223 | 3904-3935 | 4032-4063 |
| 221 | 3 | 96-127 | 224-255 | 3936-3967 | 4064-4095 |

Referring to FIG. 2, output storage of the decoded code bits is also distributed across all PDMs 221, 222. Each PDM 221, 222 stores decoded node bit sequences in output storage units 228a, 228b. The decoded node bit sequences may be stored sequentially until the codeword decoding is completed.

Referring also to FIGS. 7A-7D, decoded node bit sequences 255 depicted in FIGS. 7A-7D may be first or second decoded node bit sequences 255a, 255b depicted in FIG. 2. For each decoded node bit sequence 255, generated by the node decoding pipeline 232a, the decoded results distributor 261 transmits PSUM values 248a . . . 248h to PDMs 221, 222. Each decoded node bit sequence 255 generated by the first node decoding pipeline 232a is transmitted to one output storage unit 228a, 228b of one slave PDM or master PDM. As such, storage of decoded node bit sequences 255 is distributed among master and slave PDMs 221, 222.

The decoded node bit sequences 255a, 255b are then read by decoded bit aggregator 212 from all output storage units 228a, 228b.

FIG. 8A depicts a decoded nodes storage layout and a sequence of retrieving of data from output storage units of PDMs 221 . . . 222h by decoded bit aggregator 212, in accordance with at least one embodiment of the present disclosure. FIG. 8A depicts a non-limiting example of decoded nodes storage layout for a 32-kbit-codeword. In such embodiment, decoded node bit sequences are first stored in master PDM 221, then in second (slave) PDM 222b, then in third (slave) PDM 222c, etc. The sequence of retrieving (or, in other terms, reading) of decoded node bit sequences 255a, 255h is schematically shown with arrows 810.

FIG. 8B illustrates a method for aggregating of decoded node bit sequences of a 32-kbit-codeword from the output storage units 228a, 228b of master and slave PDMs 221, 222, where the decoded nodes were stored in accordance with FIG. 8A. Based on the decoded node bit sequences 205a, 205b . . . 205h, decoded bit aggregator 212 generates the decoded codeword bit sequence 206. In other words, based on sets 205a, 205b . . . 205h of decoded node bit sequences 255a, 255b . . . 255h, decoded bit aggregator 212 generates the decoded codeword bit sequence 206.

Figure 9A:
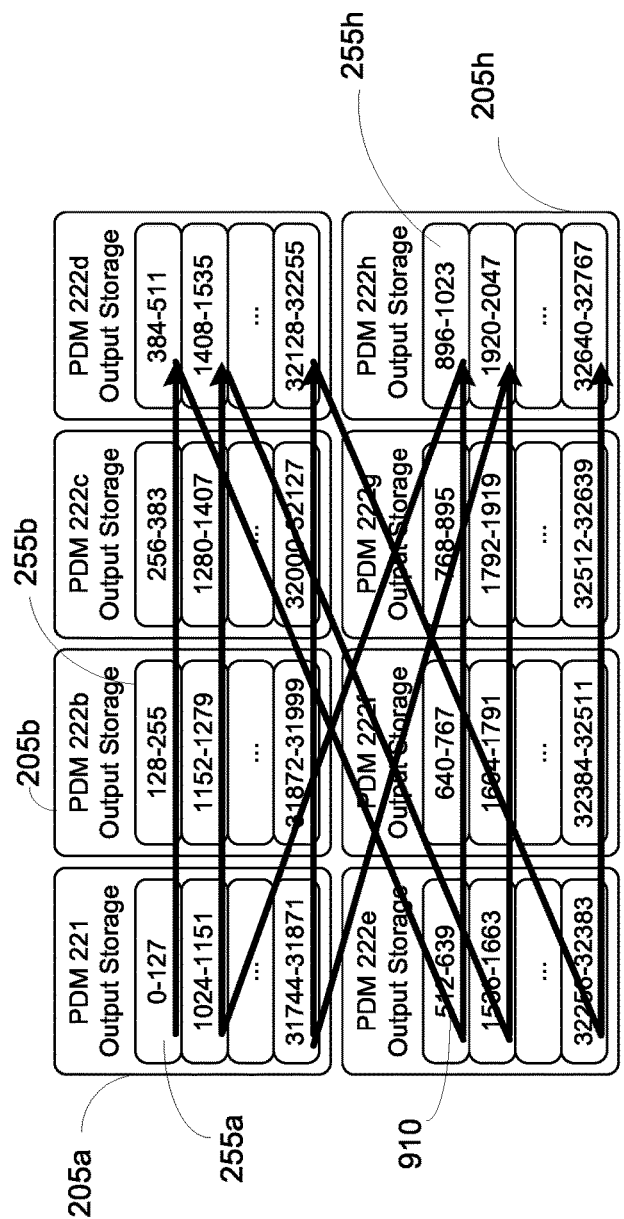
FIG. 9A depicts an alternative decoded nodes storage layout and an alternative sequence of retrieving of data from the output storage units of PDMs by a decoded bit aggregator, in accordance with at least one embodiment of the present disclosure.

FIG. 9A depicts an alternative decoded nodes storage layout and a respective sequence of retrieving data from output storage units of PDMs 221 . . . 222h by decoded bit aggregator 212, in accordance with at least one embodiment of the present disclosure. FIG. 9A depicts a non-limiting example of decoded nodes storage layout for a 32-kbit-codeword.

The sequence of retrieving of the decoded node bit sequences is schematically illustrated with arrows 910. In such embodiments, first decoded node bit sequence which corresponds to a first node may be stored in a master PDM 221, while a second decoded node bit sequence which corresponds to a second decoded node is stored in a second PDM 222b, a third decoded node bit sequence which corresponds to a third decoded node is stored in a third PDM 222c. In such embodiment, the second decoded node follows the first decoded node in the codeword, and the third decoded node follows the second decoded node in the codeword.

Figure 9B:
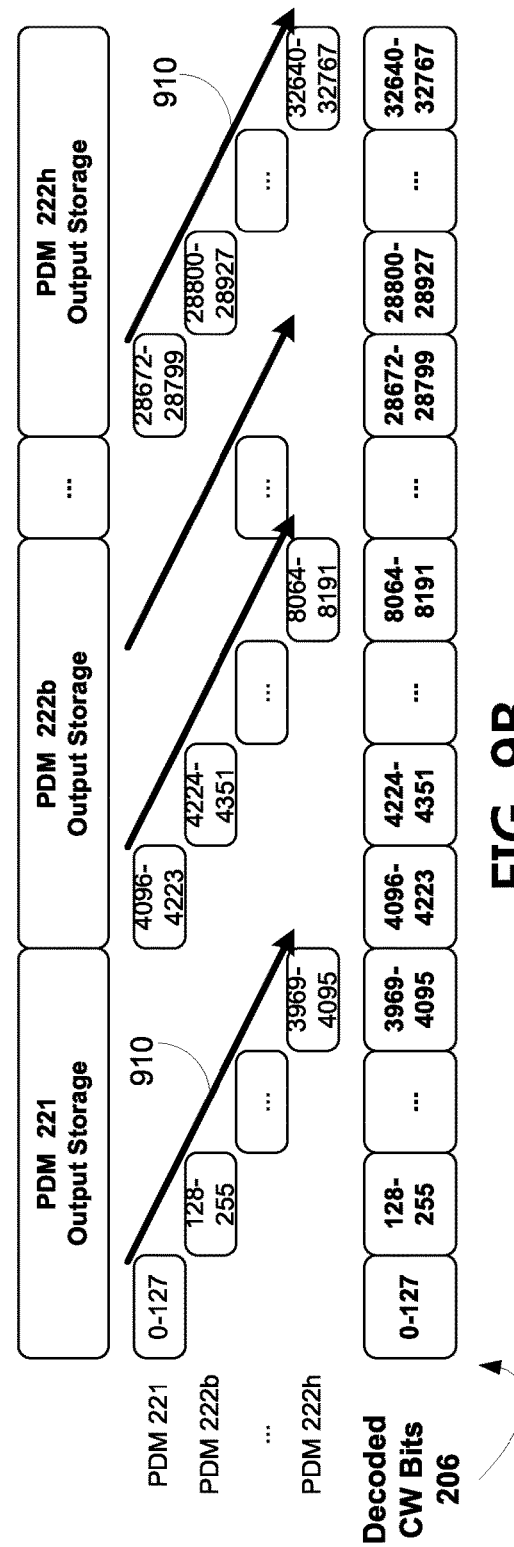
FIG. 9B depicts a timing diagram illustrating a method for aggregating of decoded node bit sequences of a 32-kbit-codeword, where the decoded nodes were stored in accordance with FIG. 9A.

FIG. 9B depicts a method of aggregating of decoded nodes of a 32-kbit-codeword from the output storage units of master and slave PDMs 221, 222, where the decoded nodes were stored in accordance with FIG. 9A. Based on decoded node bit sequences 255a . . . 255h, decoded bit aggregator 212 generates the decoded codeword bit sequence 206.

As described above, the decoding program 240 comprises a sequence of instructions. Each instruction identifies a node length and a node type of a node of the codeword that is currently being decoded. The bits of one node are decoded simultaneously. A type of decoding to perform on the bits of one node corresponds to the node type.

The first scheduler 234a is a processor which may execute the instructions of the decoding program 240. PCD 200 may be flexible to decode codewords of various code rates and polar code construction methods due to flexible decoding program 240. In some embodiments, the scheduler 234a controls the node decoding pipeline 232a and the upper-stage F-G processing units based on the codeword length, the node length, node type, and bit index of the currently decoded node. The scheduler 234a may send commands to logic units of the node decoding pipeline 232a and to the upper-stage F-G processing units to adjust to the codeword length, the node length, node type, and a bit index of the currently decoded node.

As discussed above, scheduler 234a may transmit commands to lower-stage and upper-stage processing units 242a, 250a specifying whether to perform F or G operation. Scheduler 234a may also transmit commands to first specialized decoding unit 244a. Such commands may specify which decoding logic needs to be executed by first specialized decoding unit 244a. The scheduler 234a may send commands to first PSUM unit 246a requesting to compute a specific set of partial sum values and store the set of partial sum values.

Operation of the intermediate LLR result combiner 260 depends on the codeword length and the node lengths. If the codeword length changes, intermediate LLR result combiner 260 may need to change its intermediate LLR result combining scheme.

In some embodiments, the scheduler 234a controls the intermediate LLR result combiner 260. In some embodiments, scheduler 234a may receive the codeword length in the decoding program 240. Alternatively, the scheduler 234a may determine the codeword length from the decoding program 240. The scheduler 234a may then send an indication of the codeword length and/or the node lengths to intermediate LLR result combiner 260. The intermediate LLR result combiner 260 then adjusts in order to execute the intermediate LLR result combining scheme, as discussed above, that corresponds to the codeword length. Alternatively, the scheduler 234a may send a command to the intermediate LLR result combiner 260 to adjust to the codeword length and/or the node lengths.

Figure 10:
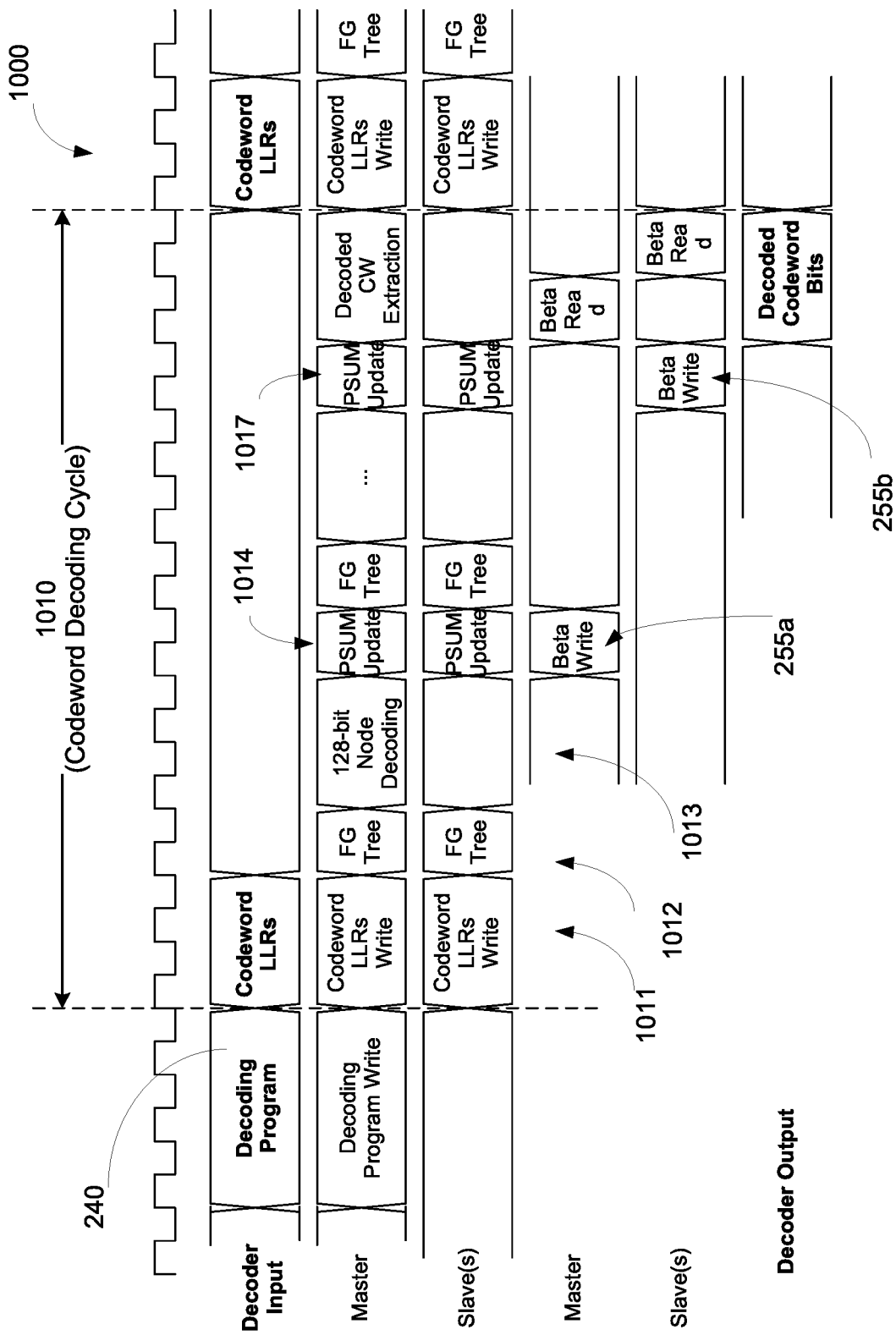
FIG. 10 depicts a timing diagram illustrating processing of channel LLRs of one codeword by PCD of FIG. 2, in accordance with various embodiments of the present disclosure.

FIG. 10 depicts a timing diagram 1000 illustrating processing of channel LLRs of one codeword by PCD 200, in accordance with various embodiments of the present disclosure.

Prior to codeword decoding cycle 1010, PCD 200 receives decoding program 240. The decoding program 240 is written to master PDM 221.

During a first segment 1011 of clock cycles, PCD 200 receives, at its input, a sequence of channel LLRs of a first codeword. Sets of LLR subsets are then written to input storage units 226a, 226b of master and slave PDMs 221, 222.

During a second segment 1012 of clock cycles, F-G processing units of both master and slave PDM 221, 222 perform F-G tree processing to generate sets of intermediate LLR results 252a, 252b. During a third segment 1013 of clock cycles, first node decoding pipeline 232a of master PDM 221 decodes an intermediate LLR result sequence 620.

During the clock cycles of the fourth segment 1014, first PSUM storage unit 247a of master PDM 221 is updated with new PSUM values calculated by the first node decoding pipeline 232a. During the same clock cycle, second PSUM storage units 247b of slave PDM(s) 222 is(are) updated with new PSUM values calculated by the first node decoding pipeline 232a. Simultaneously to the update of PSUM storage units 247a, 247b, a first decoded node bit sequence 255a is written to first output storage unit 228a.

At a clock cycle of a later segment 1017, a second decoded node bit sequence 255b is transmitted to and stored in second output storage unit 228b of the slave PDM 222b.

The second output storage unit 228b receives the second decoded node bit sequence 255b from the first node processing pipeline 232a in master PDM 221. As described above, decoded result distributor 261 is used to select and transmit the second decoded node bit sequence 255b to one of second output storage units 228b of slave PDMs 222.

The decoded node bit sequences 255a, 255b are then read from the first and second output storage units 228a, 228b and are combined into a decoded codeword bit sequence by the decoded bit aggregator 212.

Figure 11:
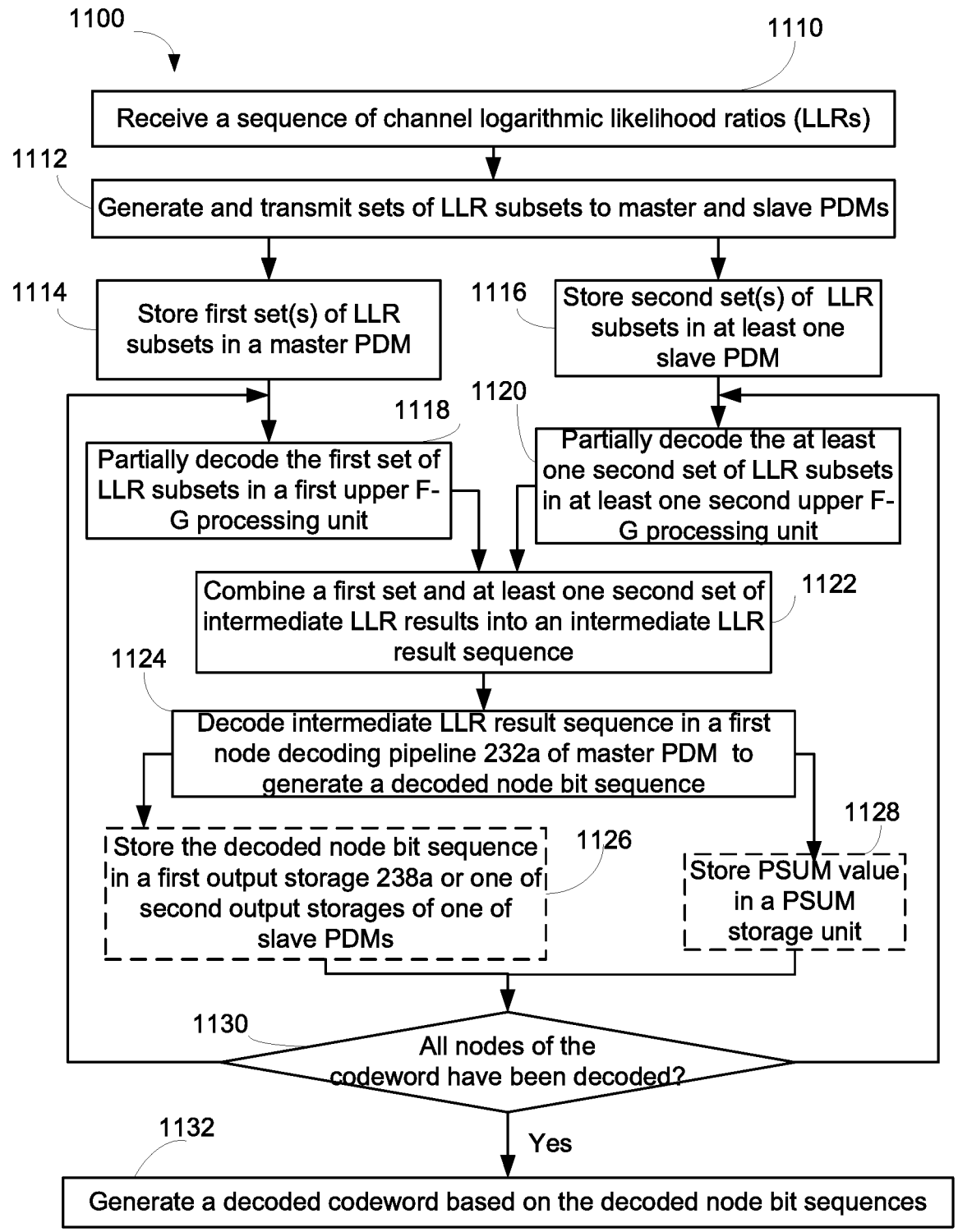
FIG. 11 illustrates a method for decoding an encoded codeword, in accordance with various embodiments of the present disclosure.

FIG. 11 illustrates a method 1100 for decoding an encoded codeword, in accordance with various embodiments of the present disclosure. When describing method 1100, reference will also be made to FIG. 2. PCD 200 depicted in FIG. 2 is configured to execute method 1100.

At step 1110, PCD 200 receives a sequence of LLRs 202. At step 1112, input LLR distributor 210 of PCD 200 generates sets of LLR subsets 203a ... 203h. At step 1114, first set of LLR subsets is transmitted to and stored in a first input storage unit 226a of master PDM 221. At step 1116, at least one second set of LLR subsets is transmitted to and stored in slave PDMs 222. As depicted in FIG. 2, each slave PDM 222 receives one set of LLR subsets 203b ... 203h. In yet other words, second PDM 222b receives set of LLR subsets 203b, third PDM 222c receives set of LLR subsets 203c, etc.

The master PDM 221 receives first sets of LLR subsets 203a, second slave PDM 222b receives second sets of LLR subsets 203b, third slave PDM 222c receives third sets of LLR subsets 203c, etc.

At step 1118, the first set of LLR subsets is partially decoded in the first upper-stage F-G processing unit 250a of the master PDM 221 to generate a first set of intermediate LLRs 252a.

At step 1120, each one of second LLR subsets are partially decoded in the second upper-stage F-G processing unit(s) of respective slave PDM(s) 222. The slave PDMs 222 generate one or more second sets of intermediate LLRs 252b.

At step 1122, intermediate LLR result combiner 260 combines the first set of intermediate LLR results and the at least one second set of intermediate LLR results to generate an intermediate LLR result sequence 620.

At step 1124, first node decoding pipeline 232a decodes the intermediate LLR result sequence to generate the decoded node bit sequence 255.

At step 1126, the first decoded node bit sequence may be stored in a first output storage 228a or one of second output storages of one of slave PDMs 222. Simultaneously, at step 1128 PSUM value may be stored in a PSUM storage unit.

At step 1130, if not all nodes of the codeword have been decoded, the method returns to steps 1118 and 1120. New sets of LLR subsets are retrieved from the input storage units in master and slave PDMs. The new sets of LLR subsets are then partially decoded by the first and second upper-stage F-G processing units 250a, 250b.

If all nodes on the codeword have been decoded, at step 1132, decoded bit aggregator 212 receives decoded node bit sequences corresponding to the codeword from output storage units 228a, 228b of PDMs 221, 222. The decoded bit aggregator 212 then generates a decoded codeword based on the received decoded node bit sequences.

Figure 12:
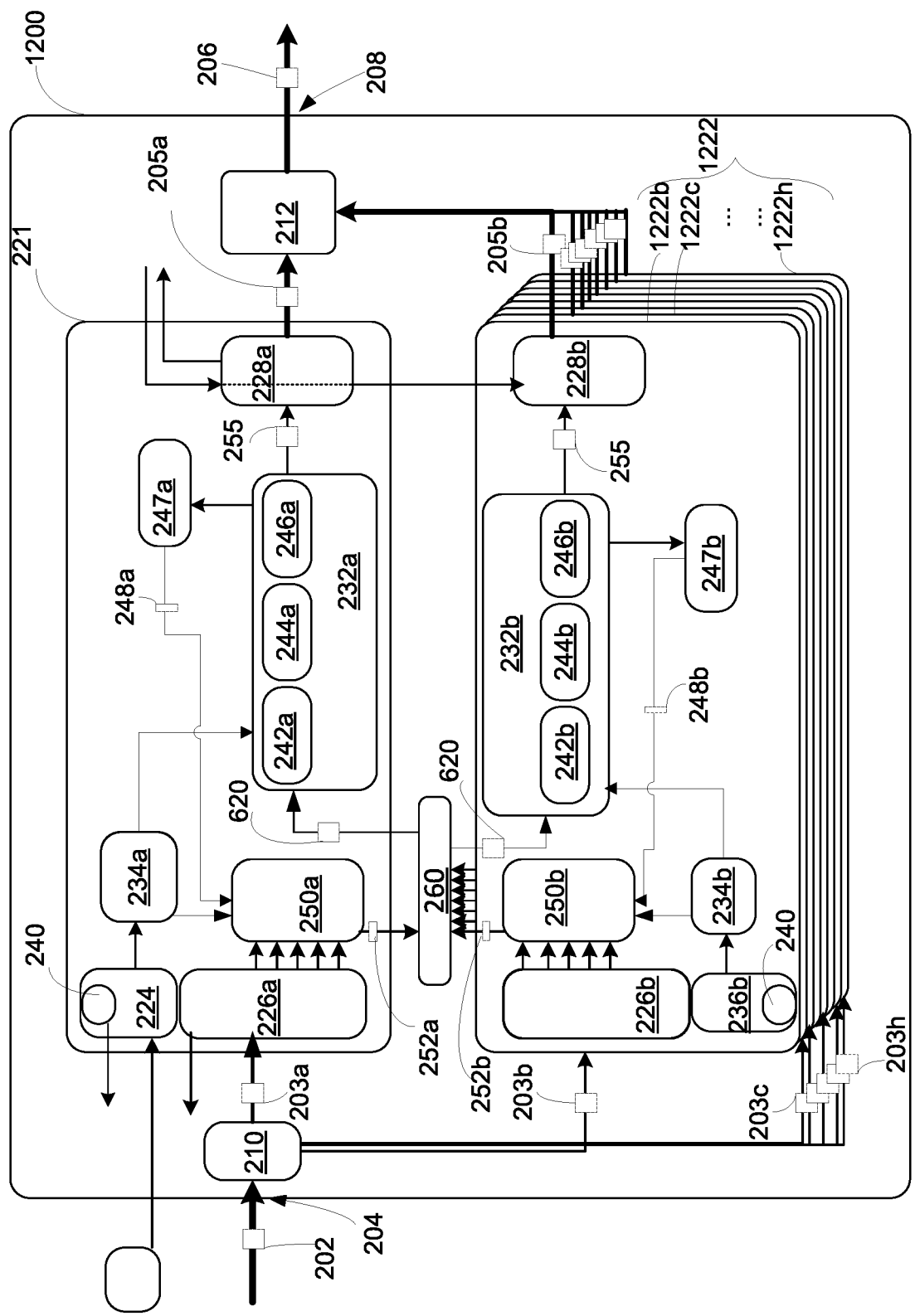
FIG. 12 depicts a distributed polar code decoder (DPCD), in accordance with various embodiments of the present disclosure.

FIG. 12 depicts a distributed polar code decoder (DPCD) 1200, in accordance with various embodiments of the present disclosure. The DPCD 1200 comprises distributed slave PDMs 1222 (1222b, 1222c ... 1222h) which have second node decoding pipelines 232b. It should be understood that DPCD 1200 may have any number of distributed slave PDMs 1222.

In DPCD 1200, the distributed slave PDMs 1222 may have the same hardware logic elements as the master PDM 221. The second node decoding pipeline 232b depicted in FIG. 12 has logic hardware elements such as a second lower-stage F-G processing unit 242b, a second specialized decoding unit 244b and a second partial sum (PSUM) unit 246b. In DPCD 1200, other slave PDMs 1222c ... 1222h also have decoding pipelines (not depicted) with similar logic units.

Similar to slave PDMs 222 of PCD 200, distributed slave PDMs 1222 of DPCD 1200 have second input storage unit 226b, second upper-stage F-G processing unit 250b, and second output storage unit 228b. Distributed slave PDMs 1222 may also have second PSUM storage unit 247b.

One or more distributed slave PDMs 1222 may also each have second program storage units 224b. The second program storage unit 224b stores a copy (a duplicate) of decoding program 240 stored in the first program storage unit 224a. In other words, the decoding programs stored in and executed by the master PDM and slave PDMs are identical. Thus first and all second schedulers 234a, 234b simultaneously execute the same decoding program 240.

The distributed slave PDMs 1222 may also each have one scheduler, such as a second scheduler 234b. The second scheduler 234b is synchronized with the first scheduler 234a. The first scheduler 234a and the second scheduler 234b are configured to execute the identical decoding program 240 simultaneously and in a synchronized manner.

The first and second schedulers 234a, 234b control logic hardware units of first and second node decoding pipelines 232a, 232b, respectively. The first and second schedulers 234a, 234b transmit commands to the logic hardware units of the first and second node decoding pipelines 232a, 232b in DPCD 1200 in a manner similar to the manner described above for the first scheduler 234a in PCD 200. Similarly, schedulers (not depicted) of the other distributed slave PDMs 1222b ... 1222h operate logic hardware elements of the corresponding other node decoding pipelines (not depicted).

In DPCD 1200, intermediate LLR result combiner 260 receives sets of LLR subsets 252a, 252b from first and second upper-stage F-G processing units of PDMs 221, 1222. The intermediate LLR result combiner 260 then generates, based on the received sets of LLR subsets 252a, 252b, the intermediate LLR result sequence 620, examples of which are depicted in FIGS. 6A-6D. In DPCD 1200, the intermediate LLR result combiner 260 transmits the intermediate LLR result sequence 620 both to first node decoding pipeline 232a of master PDM 221 and to second node decoding pipelines 232b of distributed slave PDMs 1222.

Each one second node decoding pipeline 232b receives, from the intermediate LLR result combiner 260, the intermediate LLR result sequence 620 and decodes the intermediate LLR result sequence 620 synchronously with the first node decoding pipeline 232a. Schedulers 234a, 234b are synchronized and control first node decoding pipeline 232a and second node decoding pipelines 232b synchronously based on values of the node length and node type.

Following such decoding of the intermediate LLR result sequence 620, the first node decoding pipeline 232a generates a decoded node bit sequence 255, and the second node decoding pipeline 232b generates a copy of the decoded node bit sequence 255. When there are more than one distributed slave PDM 1222 in DPCD 1200, second node decoding pipeline 232b of each PDM 1222 generates a local copy of the decoded node bit sequence 255.

In at least one embodiment of DPCD 1200, the decoding of the intermediate LLR result sequence 620 is performed in all PDMs simultaneously, for the same portion of the codeword and decoding is synchronized, in order to avoid sending the decoded node bit sequence 255 (corresponding to a decoded codeword node) and PSUM values from the master PDM 221 to the distributed slave PDMs 1222. The decoded node bit sequence 255 and PSUM values do not need to be transmitted to all slave PDMs in order to update the respective PSUM storage units 247a, 247b.

Referring also to FIGS. 2 and 8A, 8B, output storage units 228a, 228b may store the decoded node bit sequences 255 in a manner similar to PCD 200. It should be noted that each decoded node bit sequence 255 is stored in one of PDMs 221, 1222.

When all schedulers 234a, 234b control the respective node decoding pipelines 232a, 232b simultaneously, interactions between PDMs 221, 1222 are limited to interactions with the intermediate LLR result combiner 260. Such DPCD 400 may decode the codewords faster compared to PCD 200 described above, because of less logic hardware involved in processing.

Faster decoding in DPCD 1200 may be achieved due to limited interactions between the master PDM and the distributed slave PDMs. There is no need to transmit the PSUM values between the PDMs 221, 1222 because the PSUM values are available locally on each PDM 221, 1222.

The second lower-stage and upper-stage F-G processing units 242b, 250b do not need to wait for PSUM values to be received by the respective PSUM storage units 247b from master PDM 221. In DPCD 1200, PSUM values are available locally at each PDM 221, 1222, and therefore PSUM storage units may be updated immediately following the decoding of a preceding decoded node bit sequence. Thus parallel processing by node decoding pipeline 232a, 232b in all PDMs of DPCD 1200 may reduce latency.

Processing in only one node decoding pipeline 232a of master PDM 221 in PCD 200 may consume less energy compared to DPCD 1200. Nevertheless, the energy may be partially recuperated in DPCD 1200 due to the local availability of the decoded node bit sequences in each PDMs 221, 222. The energy of DPCD 1200 may be reduced because there is no need for transmission of the decoded node bit sequences to the distributed slave PDMs 1222.

In some other embodiments of DPCD 1200, decoding program 240 may be split in subprograms for various groups of codeword bits or for various nodes. For example, there may be separate programs for 4 K codeword bits. In such embodiments, the role of a "master PDM" may rotate among PDMs 221, 1222, according to the decoded bit index. For example, PDM #0 may act as a master when the codeword bits #0 to #4095 are decoded. Then, PDM #1 may act as the master for bits #4096 to #8191, and so on for all codeword bits groups. In such embodiments, the decoded node bit sequences may be transmitted across all PDMs. In such embodiments, the decoding program storage 224a, 224b may be smaller compared to the embodiments where all PDMs are executing the same decoding program 240 synchronously.

In some other embodiments, decoding program 240 may be loaded in master PDM 221, while program storage units 224b of distributed slave PDMs 1222 may be empty. In some embodiments, second schedulers 234a and second node decoding pipelines 232b in slave PDMs 1222 may be silent, such that distributed slave PDMs 1222 may operate similarly to slave PDMs 222.

As output storage units 228a, 228b of the DPCD 1200 are identical to output storage units 228a, 228b of the PCD 200, decoded node bit sequences 255 in output storage units are stored in DPCD 1200 in a similar manner. For example, decoded node bit sequences may be stored following the schematics depicted in FIGS. 8A-9B and described above with reference to PCD 200.

In some embodiments, partial decoding results for more than one node may be temporarily stored in PSUM unit 246a of the first node decoding pipeline 232a. For example, the PSUM unit 246a may accumulate partial decoding results (such as, for example, PSUM values) for four nodes that are 32 bits long, when a bus between the PSUM unit 246a and the output storage unit may transmit 128 bits at one clock cycle. When the partial decoding results for four nodes have been accumulated, PSUM unit 246a may convert the PSUM value into decoded bit sequence of estimated values and transmit all four decoded nodes (in other terms, all four decoded node bit sequences) simultaneously to the output storage unit 228a located on the same master PDM. Similarly, PSUM unit 246b may accumulate the partial decoding results.

The architecture of DPCD 1200 as described herein may also reduce the number of signals exchanged between PDMs 221, 1222, such that the architecture with a higher number of PDMs would not suffer from "top-level" congestion.

Figure 13:
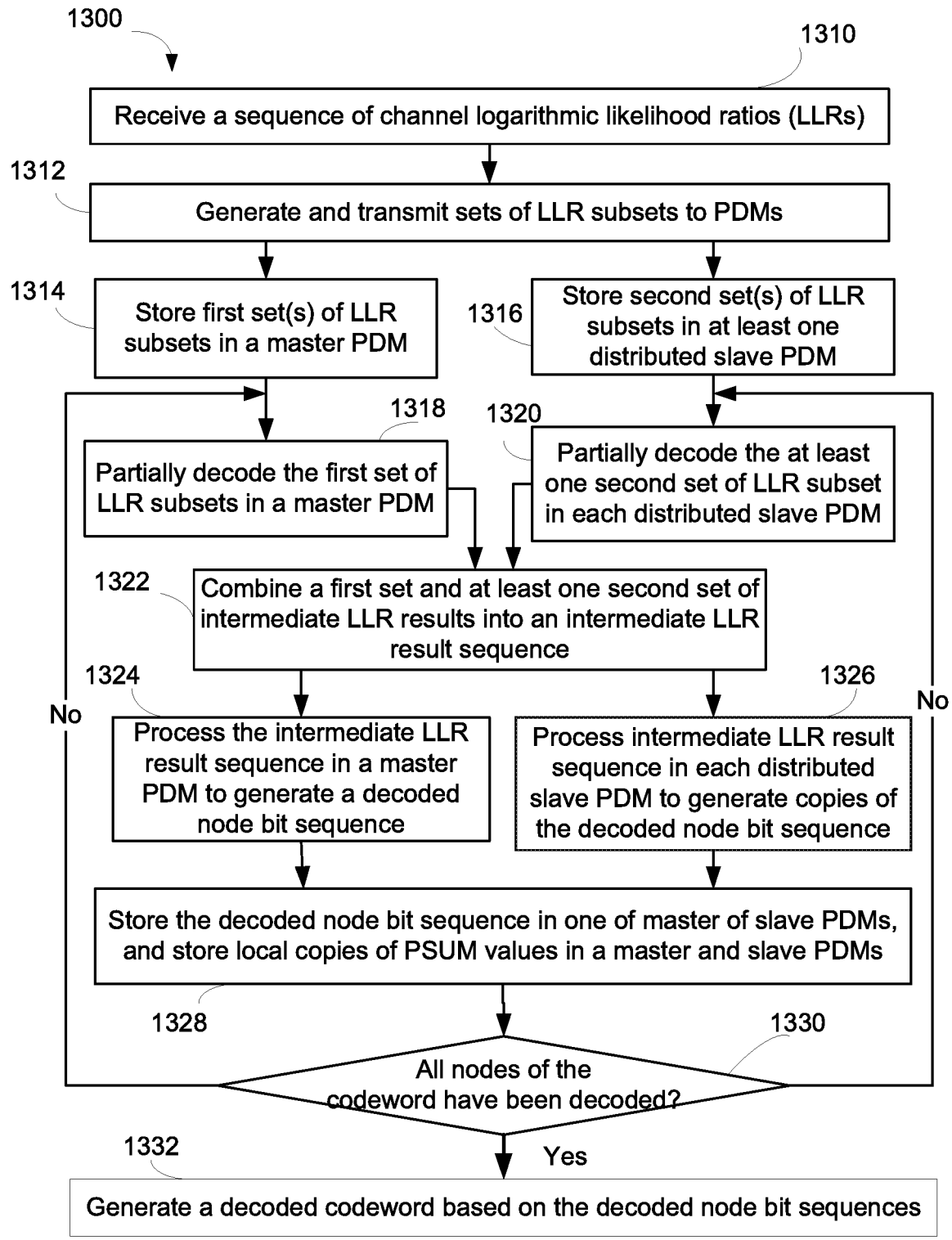
FIG. 13 illustrates another method for decoding an encoded codeword, in accordance with various embodiments of the present disclosure.

FIG. 13 illustrates another method 1300 for decoding an encoded codeword, in accordance with various embodiments of the present disclosure. When describing method 1300, reference will also be made to FIG. 12. DPCD 1200 depicted in FIG. 12 is configured to execute method 1300.

Steps 1310-1322 and steps 1330-1332 of method 1300 are identical to steps 1110-1122 and steps 1130-1132 of method 1100 depicted in FIG. 11.

At step 1310, DPCD 1200 receives a sequence of LLRs. At step 1312, DPCD 1200 generates sets of LLR subsets. At step 1314, first set of LLR subsets is transmitted to and stored in a first input storage unit of master PDM 221. At step 1316, at least one second set of LLR subsets is transmitted to and stored in distributed slave PDM(s) 1222. As depicted in FIG. 12, each distributed slave PDM 1222 receives one set of LLR subsets 203b . . . 203h.

At step 1318, the first set of LLR subsets is partially decoded in the first upper-stage F-G processing unit 250a of the master PDM 221 to generate a first set of intermediate LLRs 252a.

At step 1320, each one of second LLR subsets are partially decoded in the second upper-stage F-G processing unit(s) of respective distributed slave PDM(s) 1222. The distributed slave PDMs 1222 generate one or more second sets of intermediate LLRs 252b.

At step 1322, intermediate LLR result combiner 260 combines the first set of intermediate LLR results and the at least one second set of intermediate LLR results to generate an intermediate LLR result sequence 620.

At step 1324, first node decoding pipeline 232a in master PDM 221 decodes the intermediate LLR result sequence 620 to generate a decoded node bit sequence 255. At step 1326, second node decoding pipeline(s) 232b decode(s) the intermediate LLR result sequence 620 to generate local copies of decoded node bit sequence 255 in each one of the distributed slave PDMs 1222. Steps 1324 and 1326 are executed simultaneously and synchronously with each other such that copies of the decoded node bit sequences 255 are generated during the same clock cycle.

At step 1328, the decoded node bit sequence is stored in master PDM 221 or in one of distributed slave PDMs 1222. Simultaneously, at step 1328 local copies of PSUM values are stored in respective PSUM storage units 247a, 247b.

At step 1330, if not all nodes of the codeword have been decoded, the method returns to steps 1318 and 1320. New sets of LLR subsets are retrieved from the input storage units in master and distributed slave PDMs 221, 1221. The new sets of LLR subsets are then partially decoded by the first and second upper-stage F-G processing units 250a, 250b, respectfully.

After all nodes on the codeword have been decoded, at step 1332, decoded bit aggregator 212 receives decoded node bit sequences corresponding to the codeword from output storage units 228a, 228b of PDMs 221, 1222. The decoded bit aggregator 212 then generates a decoded codeword based on the received decoded node bit sequences.

As described above, a number of PDMs in DPCD 1200 may be determined based on the codeword length. As can be seen from Table 5, when codeword length N is equal or less than 4 kbits, the DPCD 1200 may have only 1 PDM 221. When codeword length N is longer than 4 kbits and the length of the codeword is less than 128 kbits, the DPCD 1200 may have up to 32 PDMs 221, 1222.

When the codeword length N is longer than 128 kbits, there may be up to 1024 PDMs in DPCD 1200. In some embodiments, such large number of PDMs may be grouped in PDM groups. Grouping of PDMs in PDM groups may help to reduce the number of F-G stages in lower-stage and upper-stage F-G processing units 242a, 242b, 250a, 250b.

Each PDM group may comprise several PDMs that are connected to a group intermediate LLR result combiner (not depicted). Each PDM group may have a separate group intermediate LLR result combiner. Each group intermediate LLR result combiner may be configured to receive intermediate LLR results from PDMs that are in one PDM group and generate an intermediate LLR result sequence of the PDM group. The intermediate LLR result sequence of one PDM group may be then decoded in node decoding pipelines of one or more PDMs of the same PDM group.

For example, in order to decode codewords with as many bits as N=256 kbits, PCD 200 or DPCD 1200 may have 32 PDM groups, where each PDM group has two 4-kbit-PDMs. Each 4-kbit-PDM may store and process a portion of a codeword of N=4 kbits length. Each 4-kbit-PDM of such PDM group may be connected to the group router.

In another example, in order to decode codewords with as many bits as N=4 Mbits (i.e. 4096 kbits), the PCD 200 or DPCD 1200 may have 32 PDM groups, where each PDM group may have, for example, 324-kbit-PDMs.

The PCD 200 and DPCD 1200 as described herein may be scalable to use any number of slave PDMs 222, 1222. PCD 200 and DPCD 1200 may be flexible to decode codewords of any codeword lengths due to the possibility to select any number of slave PDMs 222, 1222.

Each upper-stage F-G processing units 250a, 250b may comprise any number of F-G tree stages. Using additional F-G tree stages in upper-stage F-G processing units 250a, 250b, additional clock cycles to complete the upper F-G tree computations, and/or additional slave PDMs 222, the architecture as described herein may decode codewords of any length. A total number of PDMs may be expressed as (Nmax/4 kbits), where Nmax is the number of bits in the codeword.

One upper-stage F-G processing unit 250a, 250b may have 8 F-G tree stages and support the processing of 32-kbit-codewords. Two more additional F-G tree stages may be added to the upper-stage F-G processing unit 250a, 250b to support codewords with codeword lengths of N=128 kbits (also referred to herein as "128-kbit-codewords"). To support processing of even longer codewords, more F-G tree stages may be added to the upper-stage F-G processing unit 250a, 250b.

Alternatively, F-G tree computation may be performed over 8 and more clock cycles. Running the F-G computations over more clock cycles may increase the decoding latency. On the other hand, adding more F-G tree stages may double the hardware complexity of the F-G tree of upper-stage F-G processing unit 250a. It should be understood that in at least one embodiment, the number of F-G tree stages that are used for processing in first upper-stage F-G processing unit 250a is equal to the number of F-G tree stages that are used for processing in the second upper-stage F-G processing unit 250b.

In some embodiments, each PDM 221, 222 may have a 128-bit node decoding pipeline 232a, 232b. In order to process longer codewords, which may need PDMs with more than 128-bit node decoding pipeline 232a, 232b, PCD 200 may have various configurations.

For example, to support decoding of codewords with codeword length of Nmax=4 megabit (Mbit), PCD 200 may have 1024 PDMs, each PDM capable of processing 4 kbits. Each one of 1024 PDMs may have input storage units 226a, 226b with storage capacity of 4 kbits and decoding node pipelines configured to decode simultaneously 1024 bits.

Alternatively, to decode the same codeword of codeword length of Nmax=4 Mbit, PCD 200 may have 128 PDMs with input storage capacity of 32 kbits and decoding node pipelines configured to decode simultaneously 128 bits.

Polarization of ultra-long codewords create very long (>4 kbits) sequences of frozen and information bits. These long sequences of frozen and information bits may justify a need for additional decoding logic elements in order to decrease the decoding latency and enhance the throughput. For example, a sequence of 4 kbits frozen bits may need to bypass completely the upper F-G tree computation since the decoded values are known to be all zeros. Similarly, a sequence of 4 kbits information bits may only need a PSUM update following the F-G tree computation to estimate the decoded value of a sequence. Decoding of long (for example, longer than 4 kbits) and very long (for example, longer than 128 kbits) codewords in PCD 200 and DPCD 1200 may be simplified due to distributed decoding over slave PDMs 222, 1222. In DPCD 1200, a basic PDM building block, such as a master PDM 221 may be implemented and then replicated as many instances as may be needed for particular codeword length.

In order to support processing of long and very long codewords (for example, longer than N=128 kbits), the hardware implementation of input LLR distributor 210, PDMs 221, 222, 1222, the intermediate LLR result combiner 260, and the decoded bit aggregator 212 do not need to be modified. Rather, additional slave PDMs 222 or 1222 may be added to PCD 200 or DPCD 1200, and decoding program 240 may be replaced with another decoding program, as described above.

Hardware of PCD 200 and DPCD 1200 may be used efficiently due to sharing of intermediate LLR results and decoded codeword portions among PDMs.

The embodiments as described herein may also permit to decode shorter codewords, such as, for example, codewords with length N=4 kbits, at a higher throughput compared to conventional polar decoders. PCD 200 and DPCD 1200 may permit to maintain 80% hardware utilization ratio in the slave PDM 222, 1222 for any codeword length Nmax.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

What is claimed is:

1. A polar code decoder comprising:
   an input logarithmic likelihood ratio (LLR) distributor configured to receive a sequence of channel LLRs corresponding to at least one codeword node of an encoded codeword, and to generate sets of LLR subsets;
   a master polar decoder module (PDM) comprising a first node decoding pipeline, the master PDM configured to receive at least one first set of LLR subsets from the input LLR distributor, and, for each encoded codeword node:
      partially decode one of the at least one first set of LLR subsets to generate a first set of intermediate LLR results; and
      decode an intermediate LLR result sequence in the first node decoding pipeline to generate a decoded node bit sequence corresponding to the codeword node;
   at least one slave PDM, each slave PDM configured to receive at least one second set of LLR subsets from the input LLR distributor, and, for each encoded codeword node: partially decode one of the at least one second set of LLR subsets to generate a second set of partial computational values;
   an intermediate LLR result combiner configured to, for each encoded codeword node: receive, from the master PDM, a first set of intermediate LLR results, receive, from each one of the at least one slave PDM, a second set of intermediate LLR results, generate the intermediate LLR result sequence, and transmit the intermediate LLR result sequence to the first node decoding pipeline; and
   a decoded bit aggregator, configured to receive, for each encoded codeword node, the decoded node bit sequence and to generate a decoded codeword bit sequence based on the at least one decoded node bit sequence.

2. The polar code decoder of claim 1, wherein:
   the master PDM further comprises:
      a first input storage unit configured to receive, from the input LLR distributor, the at least one first set of LLR subsets and store the at least one first set of LLR subsets,
      a first upper-stage F-G processing unit configured to receive the first set of LLR subsets, partially decode the first set of LLR subsets, and generate the first set of intermediate LLR results;
      a first output storage unit configured to store at least one of the decoded node bit sequences; and
   each slave PDM comprises:
      a second input storage unit configured to receive, from the input LLR distributor, the at least one second set of LLR subsets and store the at least one second set of LLR subsets;
      a second upper-stage F-G processing unit configured to receive and partially decode the second set of LLR subsets, and to generate the second set of intermediate LLR results; and
      a second output storage unit, configured to store at least another one of the decoded node bit sequences.

3. The polar code decoder of claim 1, wherein the first node decoding pipeline further comprises a lower-stage F-G processing unit, a specialized decoding unit and a partial sum (PSUM) unit.

4. The polar code decoder of claim 1, wherein the master PDM further comprises a first scheduler configured to send instruction sequences to the first node decoding pipeline and the first upper-stage F-G processing unit for each encoded codeword node based on values of a codeword node length and a codeword node type of the encoded codeword node.

5. The polar code decoder of claim 4, wherein the master PDM further comprises a first program storage unit configured to receive and to store the instruction sequences, and to provide the instruction sequences to the first scheduler.

6. The polar code decoder of claim 1, wherein each one of the at least one slave PDM further comprises a second node decoding pipeline configured to:
   receive, from the intermediate LLR result combiner, a copy of the intermediate LLR result sequence, and
   decode the intermediate LLR result sequence to generate a copy of the decoded node bit sequence corresponding to the decoded codeword node.

7. The polar code decoder of claim 6, wherein the second node decoding pipeline comprises a second lower-stage F-G processing unit, a second specialized decoding unit and a second partial sum (PSUM) unit.

8. The polar code decoder of claim 7, wherein the master PDM further comprises a first scheduler configured to control:
   the first node decoding pipeline, the first upper-stage F-G processing unit, the second node decoding pipeline, and the second upper-stage F-G processing unit.

9. The polar code decoder of claim 7, wherein:
   the master PDM further comprises a first scheduler configured to control the first node decoding pipeline and the first upper-stage F-G processing unit, and
   each one of the at least one slave PDM further comprises a second scheduler configured to control the second node decoding pipeline and the second upper-stage F-G processing unit, the second scheduler being synchronized with the first scheduler.

10. The polar code decoder of claim 9, wherein:
    the master PDM further comprises a first program storage unit configured to receive and to store instruction sequences, and to transmit the instruction sequences to the first scheduler; and
    each one of the at least one slave PDM further comprises a second program storage unit configured to receive and to store the instruction sequences, and to transmit the instruction sequences to the second scheduler.

11. The polar code decoder of claim 1, wherein:
    the master PDM further comprises a first partial sum (PSUM) storage unit configured to store a first set of PSUM values determined based on the at least one decoded node bit sequence, and the first upper-stage F-G processing unit is configured to receive the first set of PSUM values from the first PSUM storage unit; and
    each one of the at least one slave PDM further comprises a second PSUM storage unit configured to receive a second set of PSUM values determined based on the at least one decoded node bit sequence, and the second upper-stage F-G processing unit is configured to receive the second set of PSUM values from the second PSUM storage unit.

12. The polar code decoder of claim 11, further comprising:
   a first output storage unit located in the master PDM and configured to store a first decoded node bit sequence, the at least one decoded node bit sequence comprising the first decoded node bit sequence and a second decoded node bit sequence;
   a second output storage unit, the second output storage unit being located in one of the at least one slave PDM, the second output storage unit being configured to store the second decoded node bit sequence; and
   a decoded results distributor configured to:
      receive the first decoded node bit sequence and the second decoded node bit sequence from the first node decoding pipeline,
      transmit the first decoded node bit sequence to the first output storage and transmit the second decoded node bit sequence to the second output storage unit, and
      transmit the first set of PSUM values determined based on the first decoded node bit sequence to the first PSUM storage, and transmit the second set of PSUM values determined based on the second decoded node bit sequence to the second PSUM storage.

13. The polar code decoder of claim 1, wherein a number of the at least one slave PDM is determined based on a codeword length.

14. A method for polar code decoding, the method comprising:
   receiving a sequence of channel logarithmic likelihood ratios (LLRs) corresponding to an encoded codeword;
   generating sets of LLR subsets based on the sequence of channel LLRs;
   for each codeword node of the encoded codeword, generating a decoded node bit sequence of at least one decoded node bit sequence by:
      partially decoding a first set of LLR subsets to generate a first set of intermediate LLR results;
      partially decoding at least one second set of LLR subsets to generate at least one second set of intermediate LLR results;
      combining the first set of intermediate LLR results and the at least one second set of intermediate LLR results to generate an intermediate LLR result sequence; and
      decoding the intermediate LLR result sequence by a first node decoding pipeline to generate the decoded node bit sequence; and
   generating a decoded codeword bit sequence based on at least one decoded node bit sequence.

15. The method of claim 14, further comprising, for each codeword node:
   determining a first set of partial sum (PSUM) values based on each one of the at least one decoded node bit sequence, and using the first set of PSUM values to partially decode the first set of LLR subsets; and
   determining a second set of PSUM values based on each one of the at least one decoded node bit sequence, and using the second set of PSUM values to partially decode the second set of LLR subsets.

16. The method of claim 14, further comprising controlling the decoding of the intermediate LLR result sequence by the first node decoding pipeline based on values of a codeword node length and a codeword node type of the encoded codeword node.

17. The method of claim 14, wherein combining the first set of intermediate LLR results and the at least one second set of intermediate LLR results to generate the intermediate LLR result sequence further comprises:
   accumulating the first set of intermediate LLR results and the at least one second set of intermediate LLR results during a plurality of clock cycles; and
   generating the intermediate LLR result sequence based on the accumulated the first set of intermediate LLR results and the at least one second set of intermediate LLR results, the intermediate LLR result sequence being generated for transmission during one clock cycle.

18. The method of claim 14, wherein the at least one decoded node bit sequence comprises a first set of the decoded node bit sequences and at least one second set of the decoded node bit sequences, and, the method further comprises:
   prior to generating the decoded codeword bit sequence, storing the first set of the decoded node bit sequences in a first output storage, storing the second set of the decoded node bit sequences in a second output storage, the first set of the decoded node bit sequences and the second set of the decoded node bit sequences having been generated by the first node decoding pipeline.

19. The method of claim 14, wherein the at least one of decoded node bit sequences comprises a first decoded node bit sequence and at least one second decoded node bit sequence, and, the method further comprises:
   for each encoded codeword node:
      synchronously with the decoding of the intermediate LLR result sequence by the first node decoding pipeline, decoding a copy of the intermediate LLR result sequence by at least one second node decoding pipeline, each second node decoding pipeline generating a copy of the decoded node bit sequence; and
   prior to generating the decoded codeword bit sequence:
      storing the first decoded node bit sequence in a first output storage, the first decoded node bit sequence being the decoded node bit sequence generated by the first node decoding pipeline; and
      storing each one of the at least one second decoded node bit sequence in a second output storage, each one of the at least one second decoded node bit sequence being the copy of the decoded node bit sequence generated by the second node decoding pipeline.

20. The method of claim 19, further comprising controlling the decoding of the intermediate LLR result sequence by the first node decoding pipeline and the second node decoding pipeline based on values of a codeword node length and a codeword node type of each codeword node.

* * * * *